(12) United States Patent
Lee et al.

(10) Patent No.: US 11,574,869 B2
(45) Date of Patent: Feb. 7, 2023

(54) SEMICONDUCTOR DEVICE AND MANUFACTURING METHOD THEREOF

(71) Applicant: SK hynix Inc., Gyeonggi-do (KR)

(72) Inventors: Ki Hong Lee, Gyeonggi-do (KR); Ki Hong Yang, Gyeonggi-do (KR); Yong Hyun Lim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 120 days.

(21) Appl. No.: 17/141,314

(22) Filed: Jan. 5, 2021

(65) Prior Publication Data
US 2021/0151376 A1 May 20, 2021

Related U.S. Application Data

(63) Continuation of application No. 16/657,787, filed on Oct. 16, 2019, now Pat. No. 10,910,311.

(30) Foreign Application Priority Data

Mar. 5, 2019 (KR) .......................... 10-2019-0025440

(51) Int. Cl.
*H01L 23/528* (2006.01)
*H01L 27/11582* (2017.01)
*H01L 27/11556* (2017.01)

(52) U.S. Cl.
CPC .... *H01L 23/5283* (2013.01); *H01L 27/11556* (2013.01); *H01L 27/11582* (2013.01)

(58) Field of Classification Search
CPC ... H01L 23/528–5286; H01L 27/11556; H01L 27/11582
See application file for complete search history.

(56) References Cited

U.S. PATENT DOCUMENTS

2017/0358356 A1* 12/2017 Lee ........................ H01L 23/528

* cited by examiner

*Primary Examiner* — Daniel P Shook
(74) *Attorney, Agent, or Firm* — IP & T Group LLP

(57) ABSTRACT

A semiconductor device includes: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug.

12 Claims, 33 Drawing Sheets

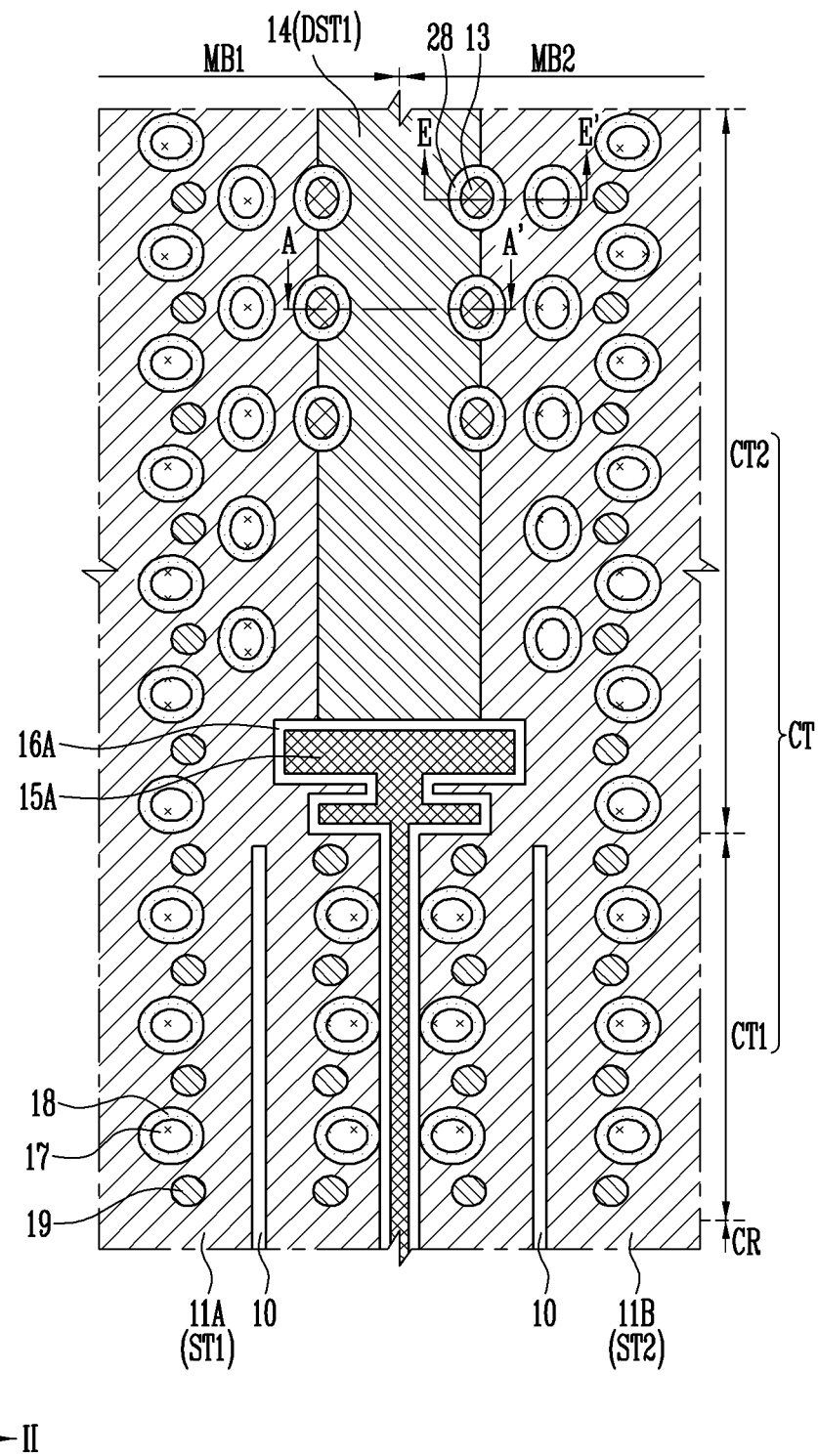

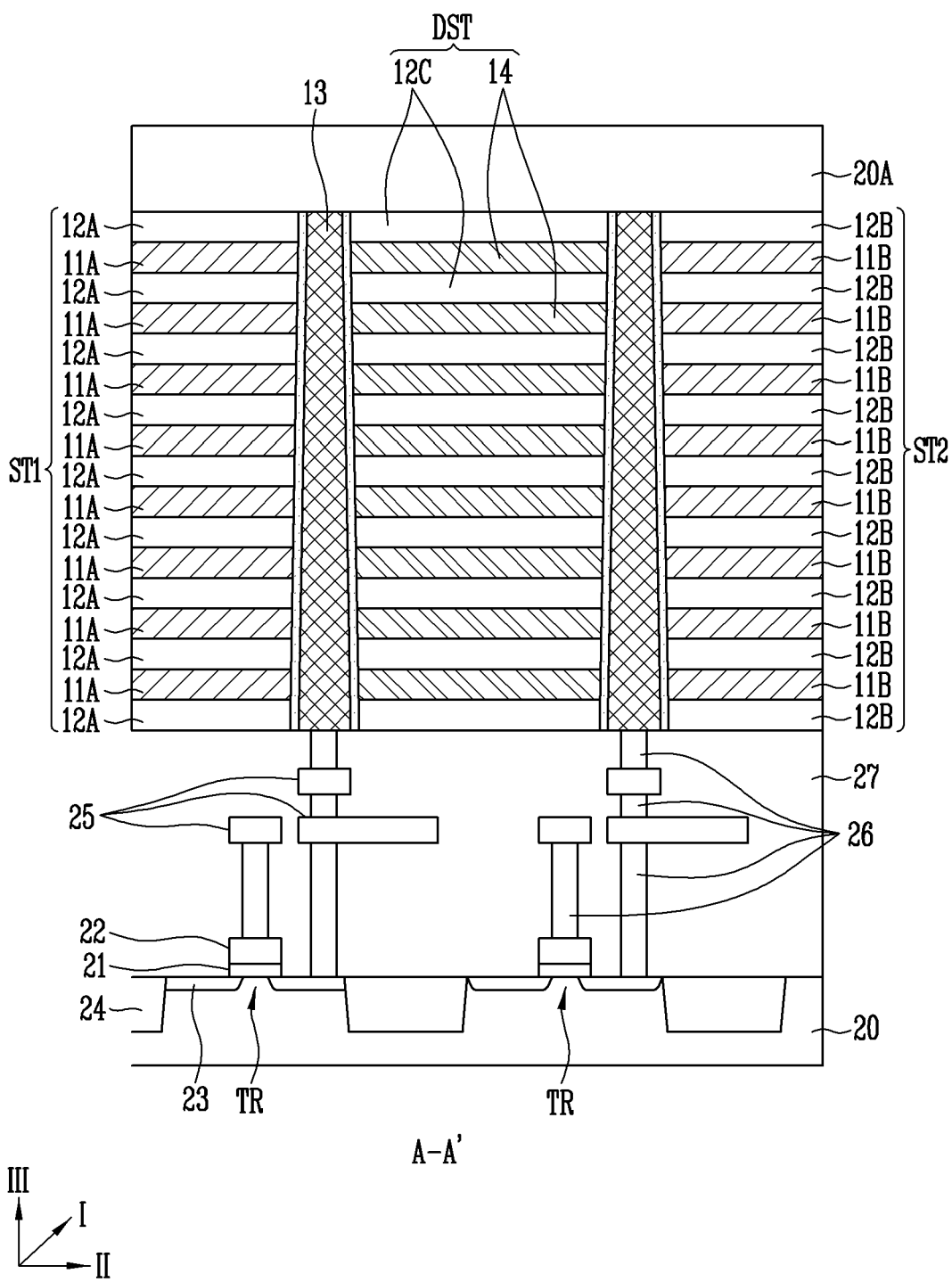

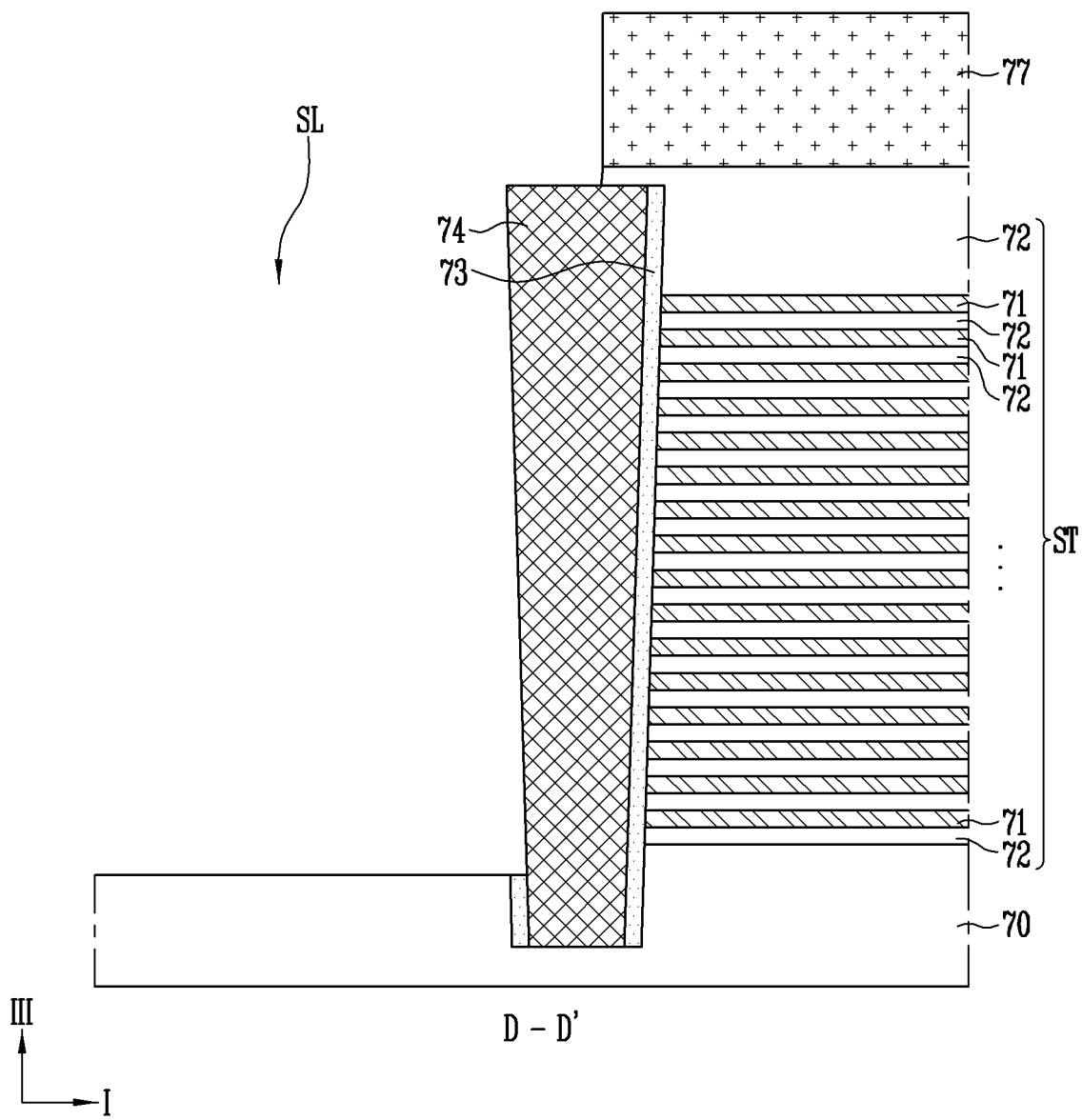

SEMICONDUCTOR DEVICE AND MANUFACTURING METHOD THEREOF

CROSS-REFERENCE TO RELATED APPLICATION

This application is a continuation of U.S. patent application Ser. No. 16/654,787 filed on Oct. 16, 2019, which claims benefits of priority of Korean Patent Application No. 10-2019-0025440 filed on Mar. 5, 2019. The disclosure of each of the foregoing application is incorporated herein by reference in its entirety.

BACKGROUND

Field of Invention

The present disclosure generally relates to an electronic device and, more particularly, to a semiconductor device and a manufacturing method thereof.

Description of Related Art

A nonvolatile memory device maintains stored data even when its power supply is interrupted. As the improvement of the degree of integration of two-dimensional nonvolatile memory devices with memory cells that are formed over a semiconductor substrate in the form of a single layer has reached the limit, there has been proposed a three-dimensional nonvolatile memory device in which memory cells are stacked in a vertical direction over a semiconductor substrate.

A three-dimensional memory device generally includes interlayer insulating layers and gate electrodes alternately stacked, channel layers penetrating the interlayer insulating layers and the gate electrodes, and memory cells are formed along the channel layers. Various structures and manufacturing methods have been developed so as to improve the characteristics and operational reliability of the three-dimensional nonvolatile memory device.

SUMMARY

Embodiments of the present invention generally provide a semiconductor device having a stable structure, and improved characteristics, and an improved manufacturing method for making the semiconductor device which is less complex and more economical to implement than existing methods.

In accordance with an aspect of the present disclosure, there is provided a semiconductor device including: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug.

In accordance with another aspect of the present disclosure, there is provided a semiconductor device including: a first stack structure including first conductive layers and first insulating layers, which are alternately stacked; a second stack structure including second conductive layers and second insulating layer, which are alternately stacked; a slit insulating layer located between the first stack structure and the second stack structure; and an insulating spacer surrounding a portion of the slit insulating layer, the insulating spacer exposing the other region.

In accordance with yet another aspect of the present disclosure, there is provided a method of manufacturing a semiconductor device, the method including: forming a stack structure; forming a conductive plug penetrating the stack structure and an insulating spacer surrounding a sidewall of the conductive plug; forming a slit penetrating the stack structure and at least a part of the insulating spacer to at least partially expose the slit exposing the conductive plug; and forming a slit insulating layer in the slit, wherein, when the slit is formed, the conductive plug protrudes to the inside of the slit.

BRIEF DESCRIPTION OF THE DRAWINGS

Various embodiments will now be described more fully hereinafter with reference to the accompanying drawings; however, it is noted that the present invention may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A to 1D are views illustrating a structure of a semiconductor device in accordance with an embodiment of the present disclosure.

FIGS. 2A to 2D are views illustrating a structure of a semiconductor device in accordance with an embodiment of the present disclosure.

FIGS. 9A to 9D are sectional views illustrating a manufacturing method of a semiconductor device.

DETAILED DESCRIPTION

Figure 1A:
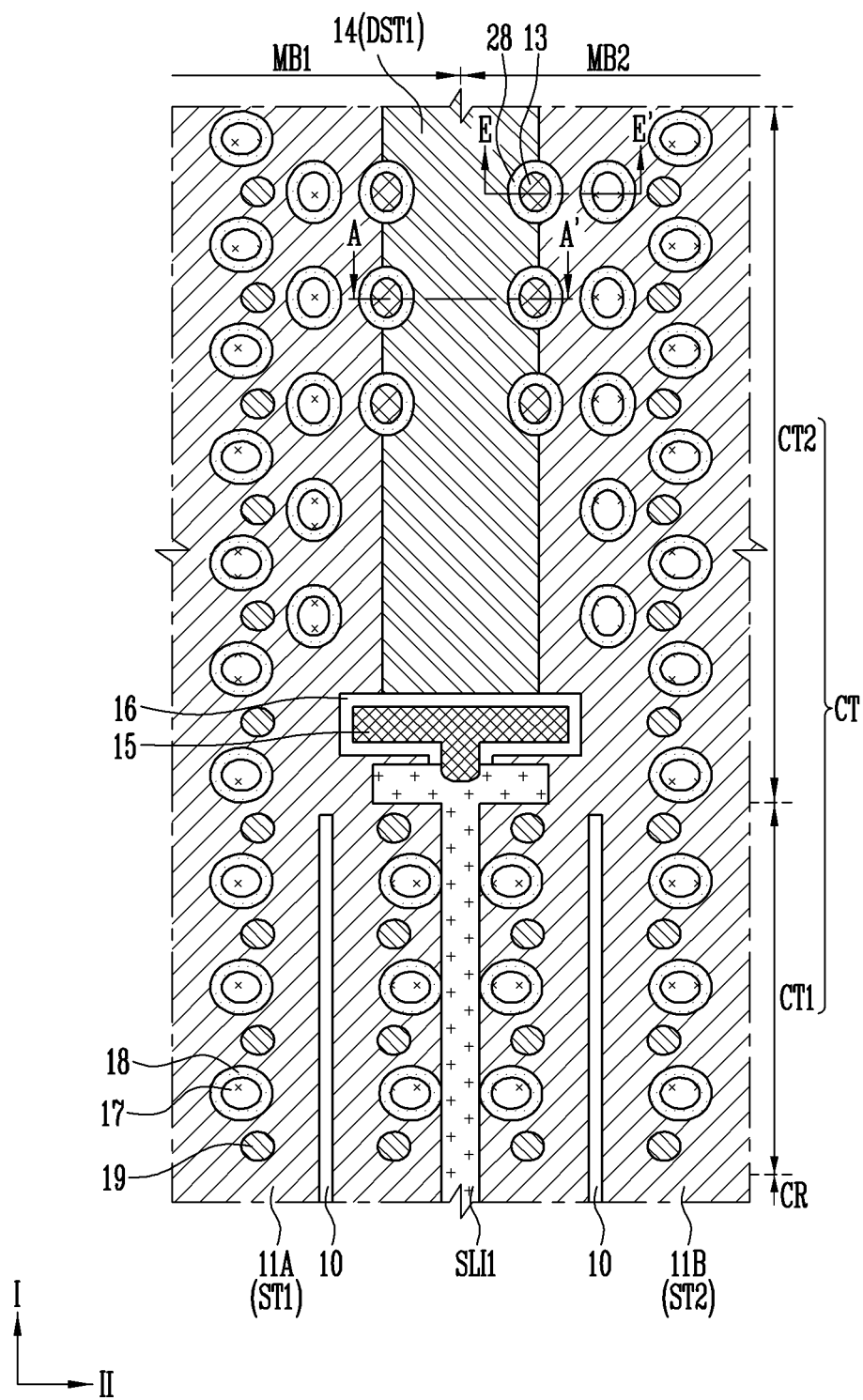

Hereinafter, various embodiments of the present invention will be described. In the drawings, the thicknesses and the intervals of elements are exaggerated for convenience of illustration, and may be exaggerated compared to an actual physical thickness. In describing the present disclosure, well-known features peripheral to the principal point of the present invention may be omitted. It should also be noted that in giving reference numerals to elements of each drawing, like reference numerals refer to like elements even though like elements are shown in different drawings.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

In the entire specification, when an element is referred to as being "connected" or "coupled" to another element, it can be directly connected or coupled to the another element or be indirectly connected or coupled to the another element with one or more intervening elements interposed therebetween.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It is noted that reference to "an embodiment," "another embodiment" or the like does not necessarily mean only one embodiment, and different references to any such phrase are not necessarily to the same embodiment(s).

Hereinafter, the various embodiments of the present invention will be described in detail with reference to the attached drawings.

FIGS. 1A to 1D are views illustrating a structure of a semiconductor device in accordance with an embodiment of the present disclosure, and may be layouts.

Referring to FIG. 1A, the semiconductor device in accordance with an embodiment of the present disclosure includes a first stack structure ST1, a second stack structure ST2, a first slit insulating layer SLI1, a conductive plug 15, and an insulating spacer 16. The semiconductor device may further include at least one of a first dummy stack structure DST1, a separation pattern 10, first contact plugs 13, contact spacers 28, supporting plugs 17, supporting spacers 18, and second contact plugs 19.

The first stack structure ST1 may include stacked first conductive layers 11A, and first insulating layers may be interposed between the stacked first conductive layers 11A. The second stack structure ST2 may be located adjacent to the first stack structure ST1 in a second direction II. The second stack structure ST2 may include stacked second conductive layers 11B, and second insulating layers may be interposed between the stacked second conductive layers 11B.

The first stack structure ST1 and the second stack structure ST2 may include a contact region CT and a cell region CR. The cell region CR is a region in which memory strings are located, and the contact region CT is a region in which an interconnection for driving the memory string is located. For example, the memory string may include a select transistor, a memory cell, a pipe transistor, and the like, each of the select transistor, the memory cell, the pipe transistor, and the like may be driven by the interconnection located in the contact region CT. In addition, the contact region CT may have a stepped shape in which each of the first and second conductive layers 11A and 11B is partially exposed.

The contact region CT may include a first contact region CT1 in which an interconnection of at least one uppermost conductive layer 11A and 11B is located and a second contact region CT2 in which interconnections of the other conductive layers 11A and 11B are located. For example, pads of upper select lines may be located in the first contact region CT1, and pads of word lines may be located in the second contact region CT2.

The first dummy stack structure DST1 may be located between the first stack structure ST1 and the second stack structure ST2, and extend in a first direction I. The first dummy stack structure DST1 may include stacked third insulating layers 14, and fourth including layers may be interposed between the stacked third insulating layers 14.

The first slit insulating layer SLI1 may be located between the first stack structure ST1 and the second stack structure ST2, and extend in the first direction I. The first slit insulating layer SLI1 may include a line pattern and an end of the line pattern may have a size larger than that of the other parts thereof. For example, the first slit insulating layer SLI1 may include a first line pattern extending in the first direction I. In addition, the first slit insulating layer SLI1 may include a second line pattern extending in the second direction II. The second line pattern may be formed at an end of the first line pattern. For example, the first slit insulating layer SLI1 may have a T shape on a plane defined by the first direction I and the second direction II.

The conductive plug 15 may be located between the first stack structure ST1 and the second stack structure ST2 along the second direction II, and between the first dummy stack structure DST1 and the first slit insulating layer SLI1 along the first direction I. For example, the first dummy stack structure DST1, the conductive plug 15, and the first slit insulating layer SLI1 may be sequentially located along the first direction I. The conductive plug 15, and the first slit insulating layer SLI1 may be connected to each other.

The conductive plug 15 may be a support for supporting a stack structure in a manufacturing process of the semiconductor device. The conductive plug 15 may be formed of or include polysilicon or a metal such as tungsten. The conductive plug 15 may extend in the first direction I to protrude to the inside of the first slit insulating layer SLI1. For example, the conductive plug 15 may protrude inside an end of the first slit insulating layer SLI1. The conductive plug 15 may protrude inside the second line pattern of the first slit insulating layer SLI1. The conductive plug 15 may have a T shape, a cross shape, a line shape, or the like on a plane defined by the first direction I and the second direction II. For example, according to the embodiment of FIG. 1A, the conductive plug 15 may have a T shape with first line pattern aligned with the first line pattern of the first slit insulating layer SLI1 and a second line pattern extending in the second direction II. In an embodiment, the second line pattern of the conductive plug 15 may be longer in the second direction than the second line pattern of the first slit insulating layer SLI1.

The insulating spacer 16 may be formed to surround a sidewall of the conductive plug 15. The insulating spacer 16 may surround the sidewall of the conductive plug 15 except for the part of the conductive plug 15 which protrudes inside the first slit insulating layer SLI1. The insulating spacer 16 may be formed to surround the other region except a region overlapping the first slit insulating layer SLI1 in the sidewall of the conductive plug 15. For example, the insulating spacer 16 is interposed between the conductive plug 15 and the first dummy stack structure DST1, between the conductive plug 15 and the first stack structure ST1, and between the conductive plug 15 and the second stack structure ST2, and is not interposed between the conductive plug 15 and the first slit insulating layer SLI1. Therefore, the conductive plug 15 may be in direct contact with the first slit insulating layer SLI1.

The first contact plugs 13 and the contact spacers 28 may penetrate the first dummy stack structure DST1. The contact spacers 28 may be formed to respectively surround sidewalls of the first contact plugs 13. The contact spacers 28 may be formed of or include an insulating material. The first contact plugs 13 and the contact spacers 28 may be located at a boundary between the first dummy stack structure DST1 and the first stack structure ST1. The first contact plugs 13 and the contact spacers 28 may also be located at a boundary between the first dummy stack structure DST1 and the second stack structure ST2, as illustrated in FIG. 1A.

The supporting plugs 17 are formed to penetrate the first stack structure ST1 and the second stack structure ST2. The supporting plugs 17 may be arranged in a line along the first direction I. The supporting plugs 17 may also be arranged in a line along the second direction II. In addition, the supporting spacers 18 may be formed to surround the sidewall of corresponding supporting plugs 17.

The separation pattern 10 may separate the first and second conductive layers 11A and 11B which are positioned at the same level from each other. The separation pattern 10 may be formed of or include an insulating material such as oxide. The separation pattern 10 may have a line shape extending along the first direction I to traverse the cell region CR and the first contact region CT1, and. The separation pattern 10 may have a depth that partially penetrates the first stack structure ST1 and/or the second stack structure ST2. For example, the separation pattern 10 may have a depth that penetrates at least one uppermost conductive layer 11A and 11B and does not penetrate the other conductive layers 11A and 11B. The at least one uppermost conductive layer 11A and 11B may be a select line. The separation pattern 10 may have a depth that penetrates the select line and does not penetrate word lines.

The second contact plugs 19 may be located in the contact region CT. The second contact plugs 19 may be distributed and arranged in the first contact region CT1 and the second contact region CT2. For example, the second contact plugs 19 arranged in the first contact region CT1 may be connected to select lines, and the second contact plugs 19 arranged in the second contact region CT2 may be connected to word lines. The second contact plugs 19 may be arranged at regular intervals in rows extending in the second direction II and also in columns extending in the first direction I. The interval between successive second contact plugs in the first and second directions may be the same or different. For example, in the embodiment of FIG. 1A the interval between successive second contact plugs 19 in the second direction may be larger than the interval between successive second contact plugs in the first direction I. The second contact plugs 19 and the supporting plugs 17 may be arranged in an alternating manner along columns extending in the first direction I. The second contact plugs 19 and the supporting plugs 17 may be arranged in different rows extending in the second direction II.

According to the structure described above, the first stack structure ST1 and the second stack structure ST2 may be electrically separated from each other by the first slit insulating layer SLI1, the conductive plug 15, the insulating spacer 16, and the first dummy stack structure DST1. For example, the first stack structure ST1 may belong to a first memory block MB1, and the second stack structure ST2 may belong to a second memory block MB2. The first slit insulating layer SLI1, the conductive plug 15, the insulating spacer 16, and the first dummy stack structure DST1 may be located at a boundary between the first memory block MB1 and the second memory block MB2, and the first memory block MB1 and the second memory block MB2 may be electrically separated from each other through the first slit insulating layer SLI1, the conductive plug 15, the insulating spacer 16, and the first dummy stack structure DST1.

In an embodiment, the conductive plug 15 may be formed together with the first contact plugs 13 when the first contact plugs 13 are formed. In another embodiment, the conductive plug 15 may be formed together with the supporting plugs 17 when the supporting plugs 17 are formed. The conductive plug 15 may be used together with the supporting plugs 17 as a support. For example, the conductive plug 15 and the supporting plugs 17 may be used as a support in a process of replacing sacrificial layers with the conductive layers 11A and 11B in the manufacturing process of the semiconductor device.

In addition, the first slit insulating layer SLI1 may be formed by filling an insulating layer in a slit used in the manufacturing process of the semiconductor device. For example, the first slit insulating layer SLI1 may be formed by filling an insulating layer in a slit used as a path for replacing the sacrificial layers with the conductive layers 11A and 11B.

Figure 1B:
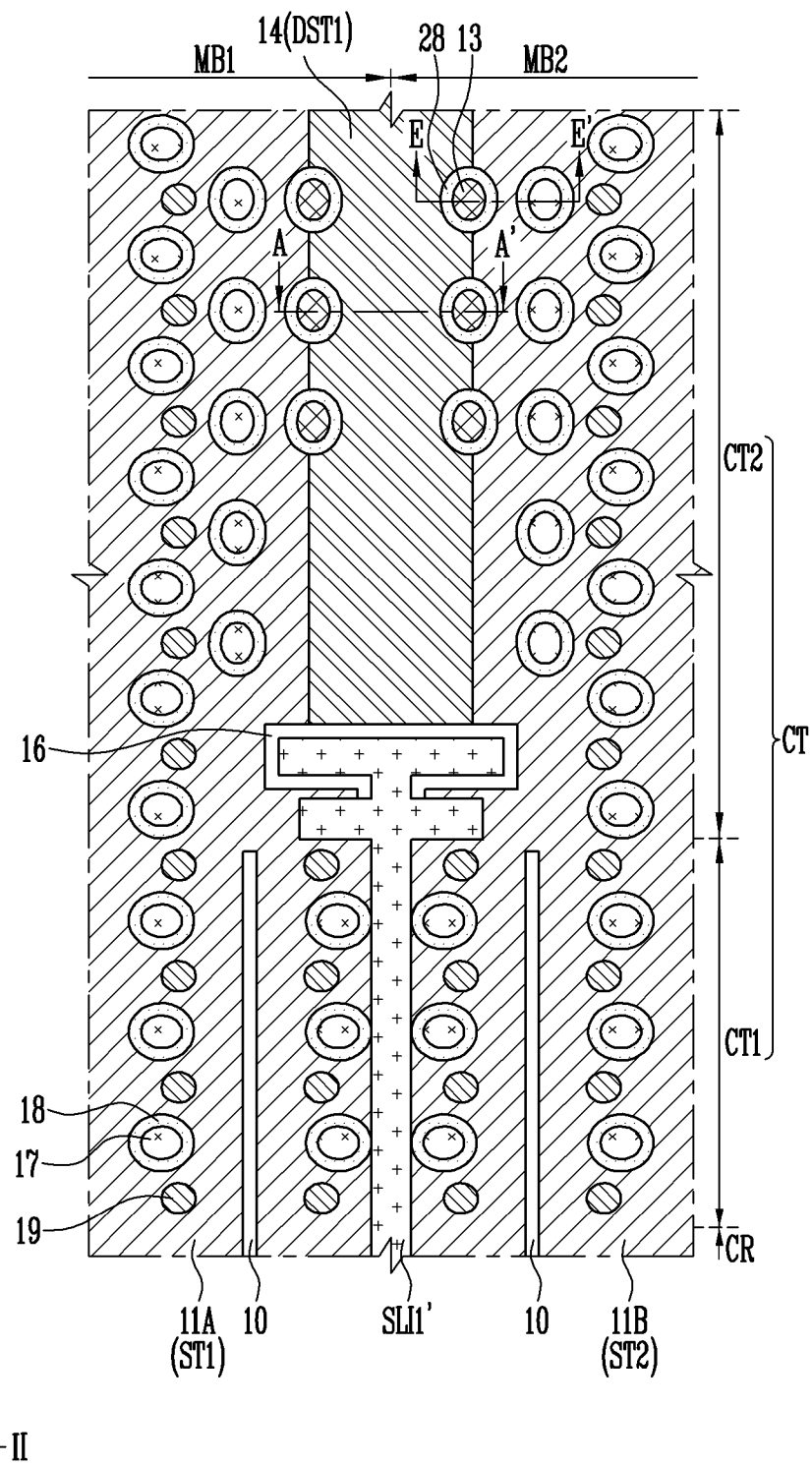

Referring to FIG. 1B, the semiconductor device may not include the conductive plug 15. For example, a first slit insulating layer SLI1' may also fill the region of the conductive plug 15 shown in FIG. 1A in addition to the region of the first insulating layer SLI1 of FIG. 1A. In addition, the insulating spacer 16 may surround the region of the first slit insulating layer SLI1' which fills the region of the conductive plug 15 shown in FIG. 1A, and expose the remaining region of the first slit insulating layer SLI1'. The first slit insulating layer SLI1', the insulating spacer 16, and the first dummy stack structure DST1 may be located at the boundary between the first memory block MB1 and the second memory block MB2, and the first memory block MB1 and the second memory block MB2 may be electrically separated from each other by the first slit insulating layer SLI1', the insulating spacer 16, and the first dummy stack structure DST1.

Referring to FIG. 1C, the semiconductor device may not include the first slit insulating layer SLI1 or SLI1'. For example, a conductive plug 15A may be filled in the region of the first slit insulating layer SLI1 of FIG. 1A or the first slit insulating layer SLI1' of FIG. 1B. In addition, an insulating spacer 16A may be formed to entirely surround a sidewall of the conductive plug 15A. The conductive plug 15A, the insulating spacer 16A, and the first dummy stack structure DST1 may be located at the boundary between the first memory block MB1 and the second memory block MB2, and the first memory block MB1 and the second memory block MB2 may be electrically separated from each other by the conductive plug 15A, the insulating spacer 16A, and the first dummy stack structure DST1.

Figure 1D:
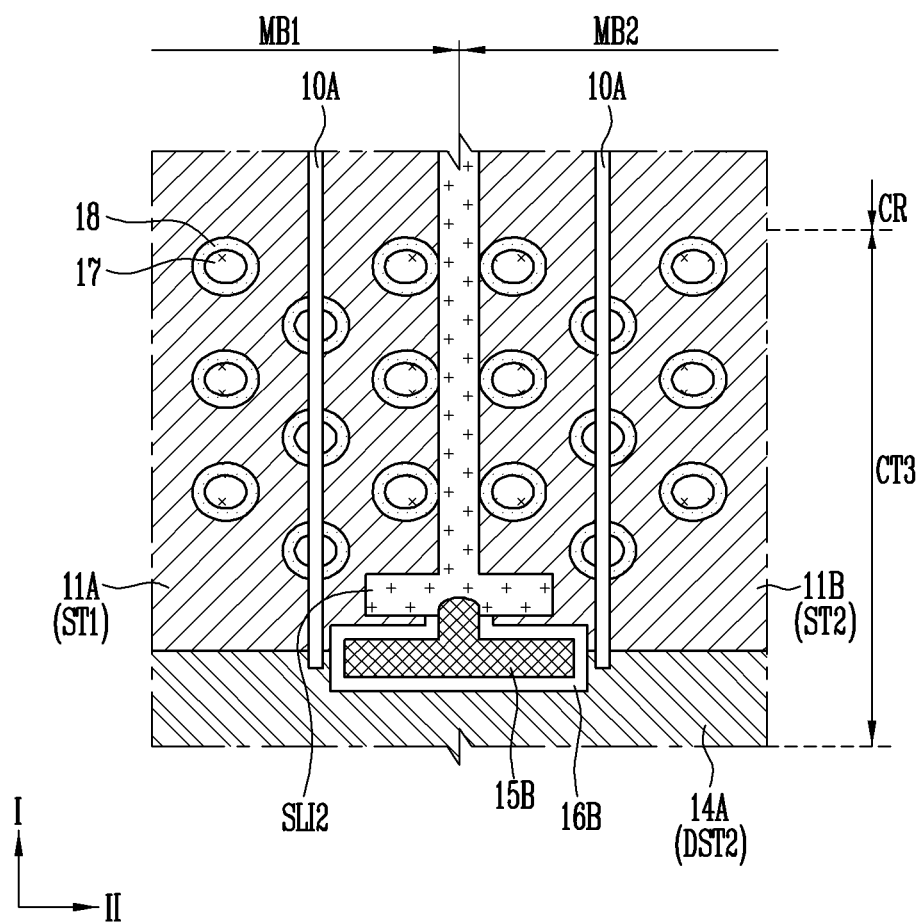

Referring to FIG. 1D, the semiconductor device may further include a third contact region CT3. The third contact region CT3 may be located adjacent to the cell region CR in the first direction I, so that the cell region CR is located between the first contact region CT1 described with reference to FIGS. 1A to 1C and the third contact region CT3 which is shown in FIG. 1D.

The semiconductor device may further include a second dummy stack structure DST2 located in the third contact region CT3. The second dummy stack structure DST2 may include stacked third insulating layers 14A, and fourth insulating layers may be interposed between the stacked insulating layers 14A.

A separation pattern 10A may be located in the cell region CR and the third contact region CT3. The separation pattern 10A may be formed by allowing the separation pattern 10 described with reference to FIGS. 1A to 1C to extend along the first direction I inside the third contact region CT3. The separation pattern 10A may extend partially inside the second dummy stack structure DST2. The separation pattern 10A may be formed to be connected to the separation pattern 10. The separation pattern 10A may extend in the first direction I, and partially overlap with the second dummy stack structure DST2. The separation pattern 10A may have a depth that partially penetrates the first stack structure ST1 and the second stack structure ST2.

The semiconductor device may further include a second slit insulating layer SLI2. The second slit insulating layer SLI2 may be interposed between the first stack structure ST1 and the second stack structure ST2, and extend in the first direction I. The second slit insulating layer SLI2 may be connected to the first slit insulating layer SLI1 or SLI1' shown in FIG. 1A or 1B, and the first slit insulating layer SLI1 or SLI1' and the second slit insulating layer SLI2 may constitute one layer.

The semiconductor device may further include a conductive plug 15B and an insulating spacer 16B. The conductive plug 15B may protrude to the inside of the second slit insulating layer SLI2, e.g., the other end of the slit insulating layer SLI2 which is situated the farthest away from the end that is in contact with the conductive plug 15 shown in FIG. 1A. The insulating spacer 16B may be formed to surround the other region except a region protruding to the inside of the second slit insulating layer SLI2 in a sidewall of the conductive plug 15B. In an embodiment, the conductive plug 15B, the insulating spacer 16B and the end of the slit insulating layer SLI2, each may have a shape that is a mirror image to the shape of the conductive plug 15, the insulating spacer 16, and the end of the first insulating layer SLI1 along an axis of symmetry extending in the second direction II.

Therefore, the first stack structure ST1 and the second stack structure ST2 may be electrically separated from each other by the second slit insulating layer SLI2, the conductive plug 15B, and the insulating spacer 16B. The second slit insulating layer SLI2, the conductive plug 15B, and the insulating spacer 16B may also be modified as shown in FIG. 1B or 1C for the first slit insulating layer SLI1, the conductive plug 15, and the insulating spacer 16 of FIG. 1A.

Figure 2A:
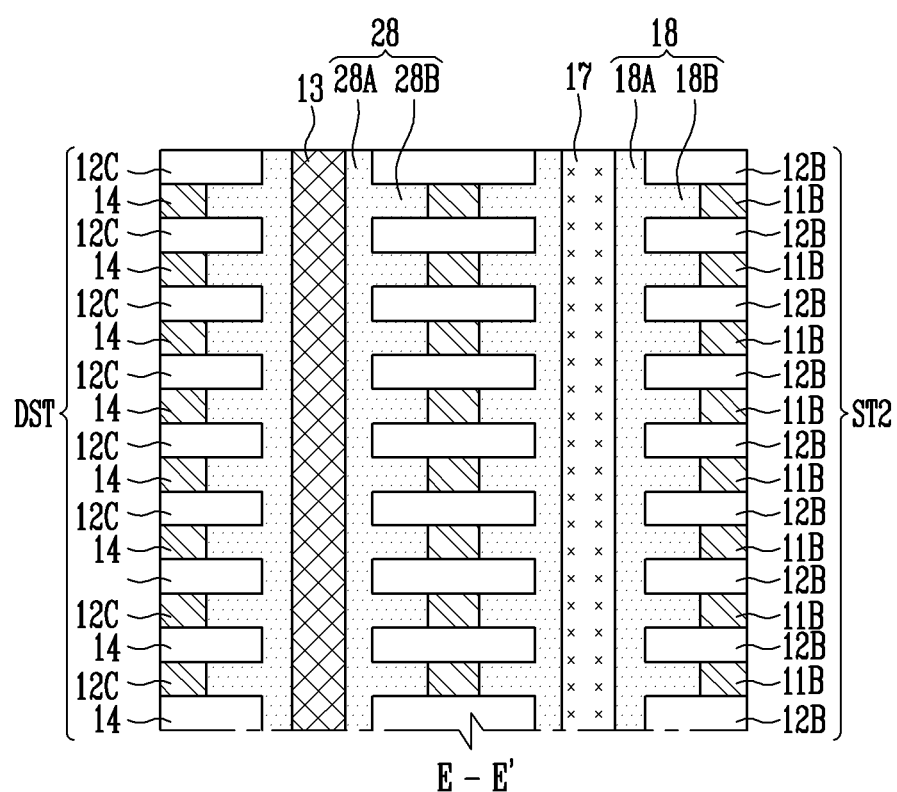
Figure 2B:
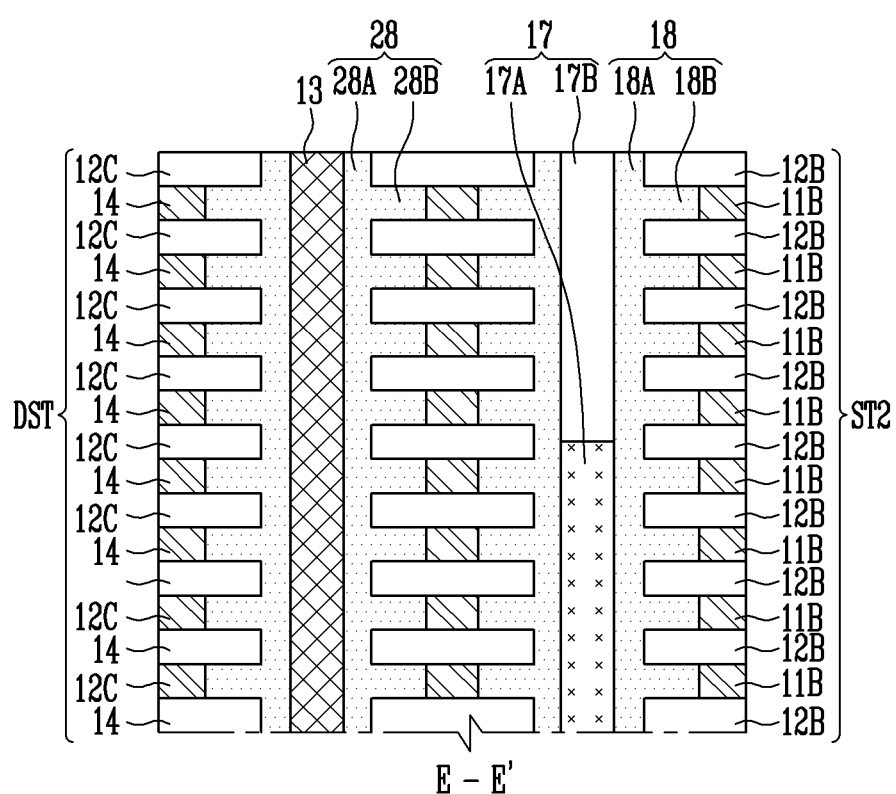

FIGS. 2A to 2D are views illustrating a structure of a semiconductor device in accordance with an embodiment of the present disclosure. FIGS. 2A and 2B are sectional views taken along line E-E' shown in FIGS. 1A to 1C, and FIGS. 2C and 2D are sectional views taken along line A-A' shown in FIGS. 1A to 1C.

Figure 2C:
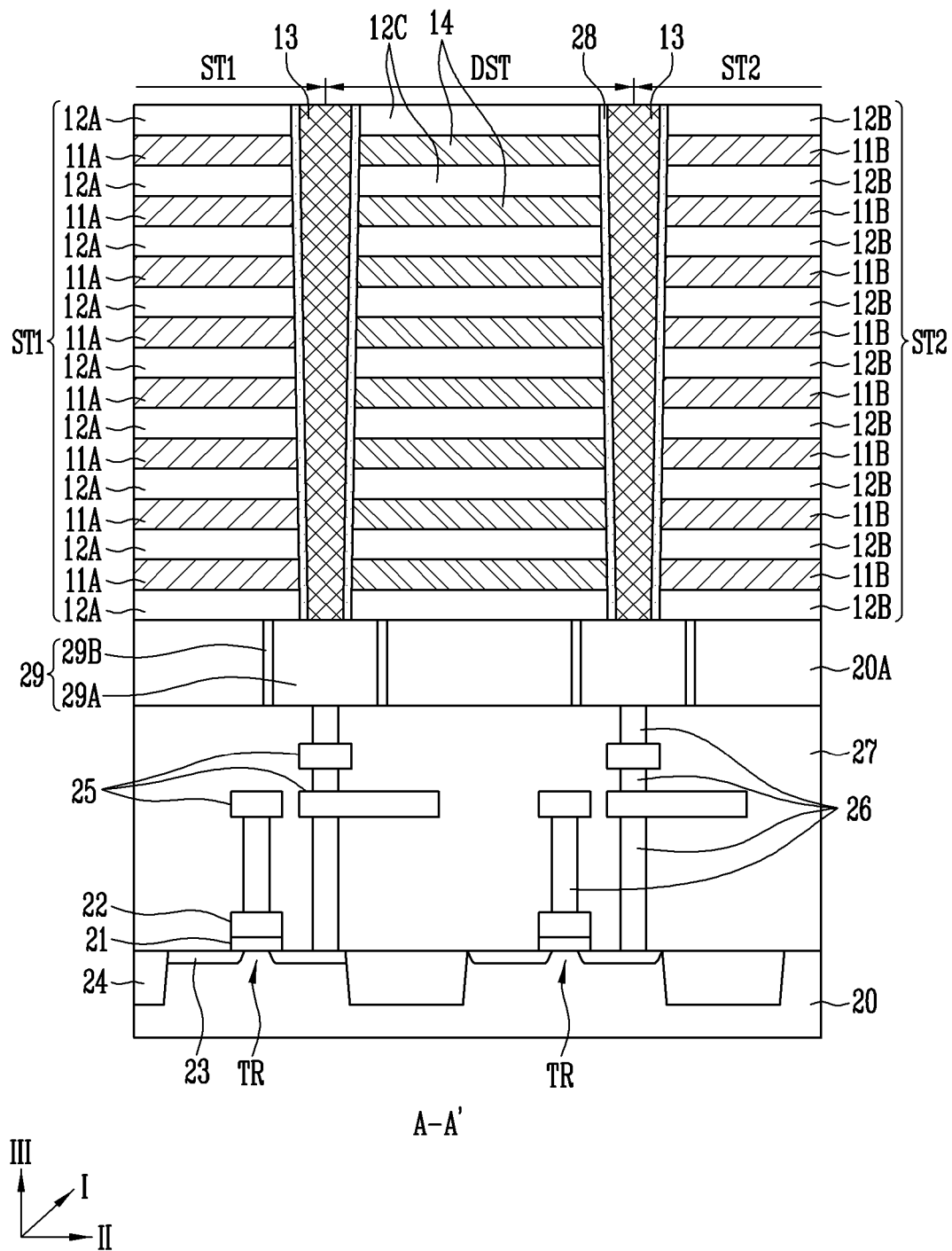

Referring to FIGS. 2A to 2D, a first stack structure ST1 may include first conductive layers 11A and first insulating layers 12A, which are alternately stacked in a third direction III (see FIGS. 2C and 2D). The third direction III may be perpendicular to the plane defined by the first and second directions I and II. A second stack structure ST2 may be located adjacent to the first stack structure ST1 in the second direction II. The second stack structure ST2 may include second conductive layers 11B and second insulating layers 12B, which are alternately stacked in the third direction III. The first conductive layers 11A and corresponding second conductive layers 11B may be located at same levels, and may be formed or include the same material. The first insulating layers 12A and corresponding second insulating layers 12B may be located at same levels, and may be formed or include the same material. A pair of a first insulating layer 12A and a second insulating layer 12B, which are located at the same level, may constitute one layer. The second stack structure ST2 may be the second stack structure ST2 described with reference to FIGS. 1A to 1D.

A dummy stack structure DST may include third insulating layers 14 and fourth insulating layers 12C, which are alternately stacked in the third direction III, as shown in FIGS. 2A and 2B. The third insulating layers 14 may be located at same levels as corresponding first and second conductive layers 11A and 11B. The fourth insulating layers 12C may be located at same levels as corresponding first and second insulating layers 12A and 12B, and may be formed or include the same material as the first and second insulating layers 12A and 12B. In addition, a first insulating layer 12A, a second insulating layer 12B, and a fourth insulating layer 12C, which are located at the same level, may constitute one layer in which the first insulating layer 12A, the second insulating layer 12B, and the fourth insulating layer 12C are connected to each other. The dummy stack structure DST may be the first dummy stack structure DST1 described with reference to FIGS. 1A to 1C or the second dummy stack structure DST2 described with reference to FIG. 1D.

Referring to FIGS. 2A and 2B, each of the contact spacers 28 may include a first part 28A surrounding a sidewall of a corresponding first contact plug 13 and second parts 23B protruding from the first part 28A in the second direction II at levels corresponding to the first conductive layers 11A, the second conductive layers 11B, and the third insulating layers 14.

Supporting spacers 18 may have a structure similar to that of the contact spacers 28. Each of the supporting spacers 18 may include a first part 18A surrounding a sidewall of a corresponding supporting plug 17 and second parts 18B protruding from the first part 18A at levels corresponding to the levels of the first conductive layers 11A, the second conductive layers 11B, and the third insulating layers 14. A second part 28B and a second part 18B located at substantially the same level may be connected to each other.

The supporting plug 17 may have a single layer. The supporting plug 17 may have a stack-layered structure. Referring to FIG. 2A, the supporting plug 17 may be a single layer formed of or including polysilicon, tungsten, metal, and the like. Referring to FIG. 2B, the supporting plug 17 may be a stack-layered structure including a first layer 17A formed of or including polysilicon, tungsten, metal, and the like, and a second layer 17B formed of or including a dielectric material.

Referring to FIGS. 2C and 2D, a peripheral circuit, interconnection structures 25 and 26, and the like may be located on or over the bottom of the first stack structure ST1, the second stack structure ST2, and the dummy stack structure DST. The first contact plugs 13 may extend in the third direction III to penetrate through the dummy stack structure DST to contact the top surface of a conductive layer 29A of a pad structure 29. The first contact plugs 13 may be electrically connected to the peripheral circuit, the interconnection structures 25 and 26, and the like. For example, each first contact plug 13 may be electrically connected to the peripheral circuit through a corresponding pad structure 29 and an interconnection structure 25 or 26. Referring to FIG. 2C, the first contact plugs 13 may have a cross-sectional area which is reduced gradually in the direction toward the corresponding pad structures 29. Referring to FIG. 2D, the first contact plugs 13 may have a cross-sectional area which is increased gradually in the direction toward the bottom thereof.

The semiconductor device may further include a first substrate 20. The first substrate 20 may be any suitable substrate. The first substrate may be a semiconductor substrate. The peripheral circuit may be located in or on the first substrate 20. The peripheral circuit may be a circuit for driving a cell array, and may include a transistor, a switch, a resistor, an amplifier, and the like. For example, a transistor TR may include a gate electrode 22, a gate insulating layer 21, and junctions 23. In addition, an isolation layer 24 may be located in the first substrate 20 between successive transistors TR. It is noted that the described peripheral circuit is a simplified example of a peripheral circuit and is not intended to limit the invention in this regard.

An interlayer insulating layer 27 may be located on or over the first substrate 20. The interlayer insulating layer 27 may be located on the first substrate 20. The interconnection structures 25 and 26 may be located in the interlayer insulating layer 27. The interconnection structures 25 and 26 may include a line, a contact plug, a pad, and the like. Lines 25 may be arranged in a multi-layer, and be connected to the gate electrode 22 of the transistor TR or one of the junctions 23 of the transistor TR. In addition, contact plugs 26 may connect the lines 25 to each other, or electrically connect the line 25 to the junction 23, the gate electrode 22, the pad, and the like.

The semiconductor device may further include a second substrate 20A. The second substrate 20A may be a semiconductor substrate including a source region or be a source layer including a conductive material. Referring to FIG. 2C, the second substrate 20A may be located between the first substrate 20 and the stack structures ST1, ST2, and DST. The second substrate 20A may be formed on or over the interlayer insulating layer 27. The second substrate 20A may include the pad structures 29. The pad structures 29 may correspond to the first contact plugs 13 and the interconnection structures 25, 26 in a one to one relationship so that each of the first contact plugs 13 may be connected to a corresponding interconnection structure 25, 26 through one of the pad structures 29. Each of the pad structures 29 may include the conductive layer 29A and an insulating layer 29B interposed between the conductive layer 29A and the second substrate 20A. Referring to FIG. 2D, the second substrate 20A may be located on the stack structures ST1, ST2, and DST.

Figure 3:
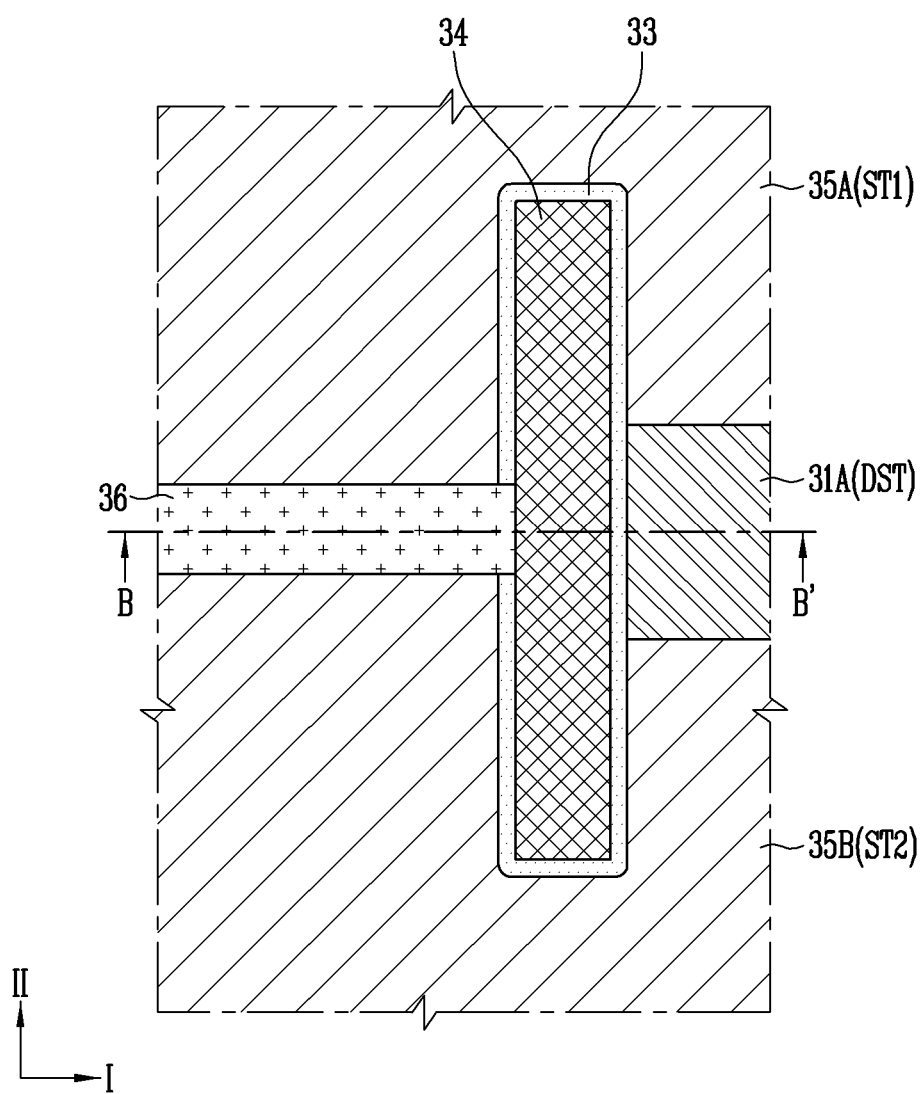
FIG. 3 is a layout illustrating a structure of a semiconductor device in accordance with an embodiment of the present disclosure.

FIG. 3 is a layout illustrating a structure of a semiconductor device in accordance with an embodiment of the present disclosure. Hereinafter, descriptions of contents overlapping with those described above will be omitted.

Referring to FIG. 3, the semiconductor device in accordance with an embodiment of the present disclosure includes a first stack structure ST1, a second stack structure ST2, a slit insulating layer 36, a conductive plug 34, an insulating spacer 33, and a dummy stack structure DST.

The first stack structure ST1 may include stacked first conductive layers 35A, the second stack structure ST2 may include stacked second conductive layers 35B, and the dummy stack structure DST may include stacked sacrificial layers 31A. The first conductive layers 35A and the second conductive layers 35B may be electrically separated from each other by the slit insulating layer 36, the conductive plug 34, the insulating spacer 33, and the dummy stack structure DST. The first slit insulating layer 36 and the dummy stack structure DST may each have a line shape extending in the first direction I. The first slit insulating layer 36 and the dummy stack structure DST may be collinear. In an embodiment, the dummy stack structure DST may be larger in the second direction II than the slit insulating layer 36. The conductive plug 34 may have a line shape extending in the second direction II. The conductive plug 34 may be disposed between the slit insulating layer 36 and the dummy stack structure DST along the first direction I. The insulating layer 33 may be surrounding the conductive plug 34 except for a region which comes into contact with the slit insulating layer 36. The insulating layer 33 may be interposed between the dummy stack structure DST and the conductive plug 34. In an embodiment, the conductive plug 34 may be larger than the dummy stack structure DST in the second direction II.

Figure 4A:
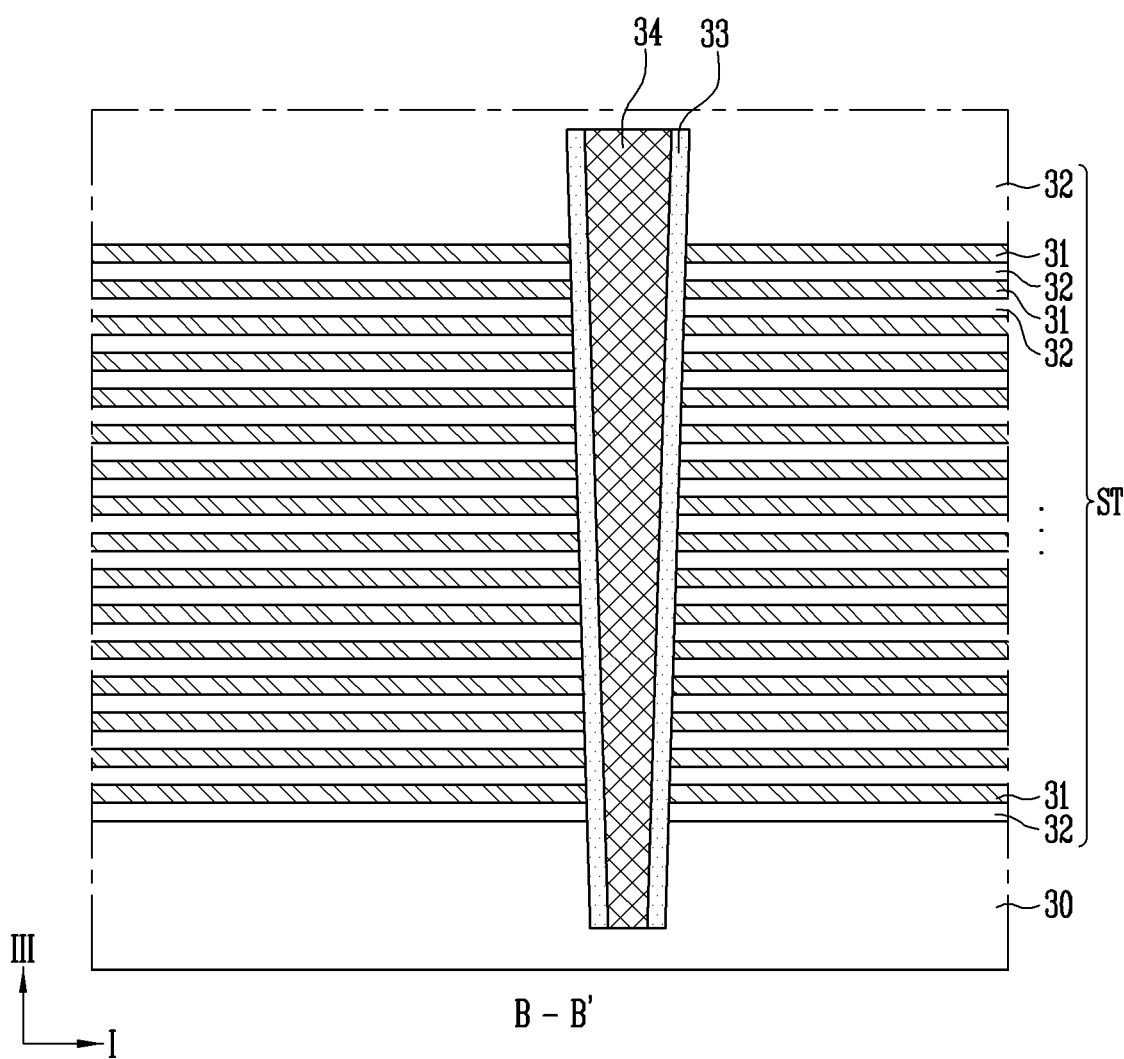
FIGS. 4A to 4C are sectional views illustrating a manufacturing method of a semiconductor device.
Figure 4B:
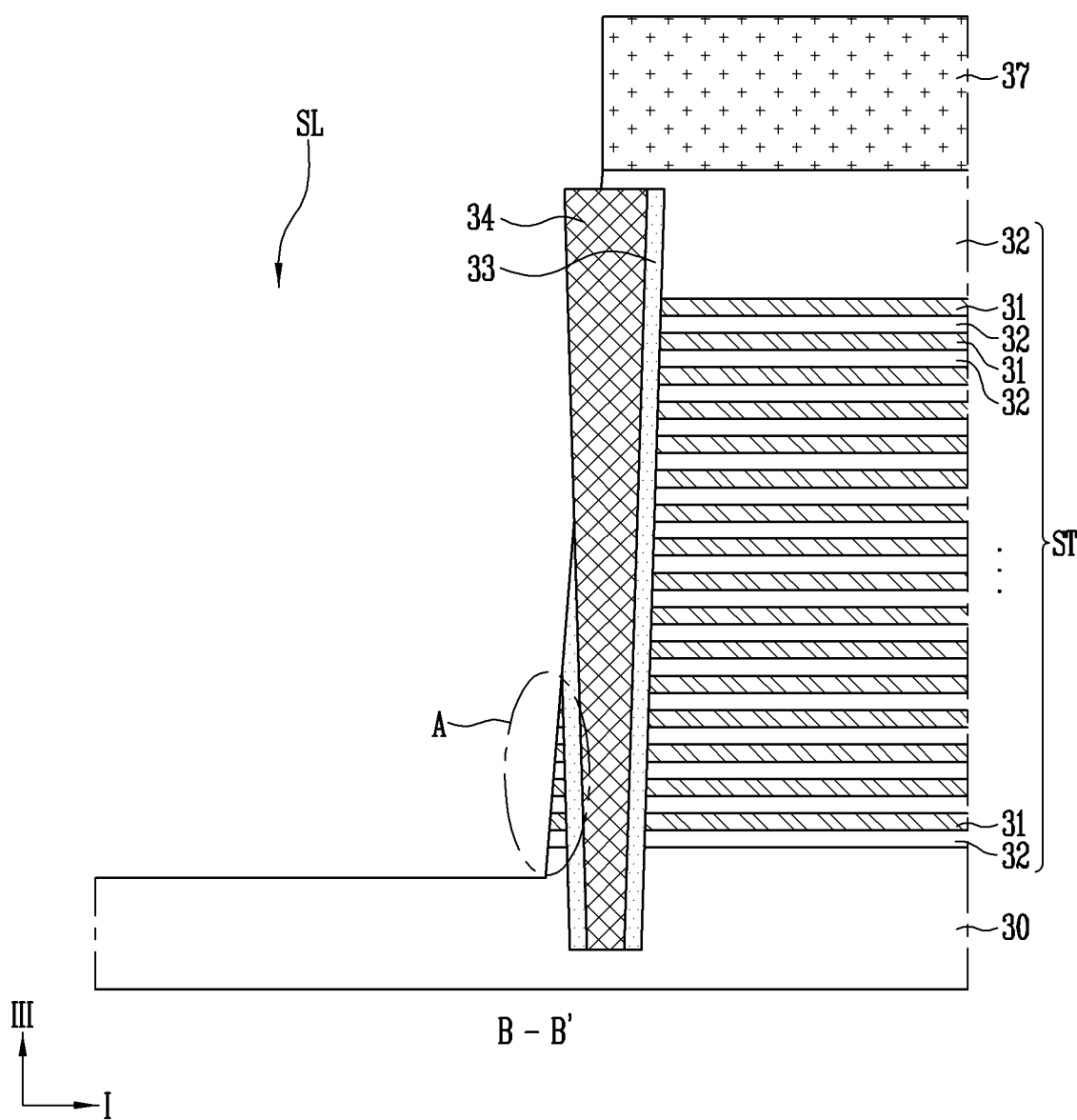
Figure 4C:
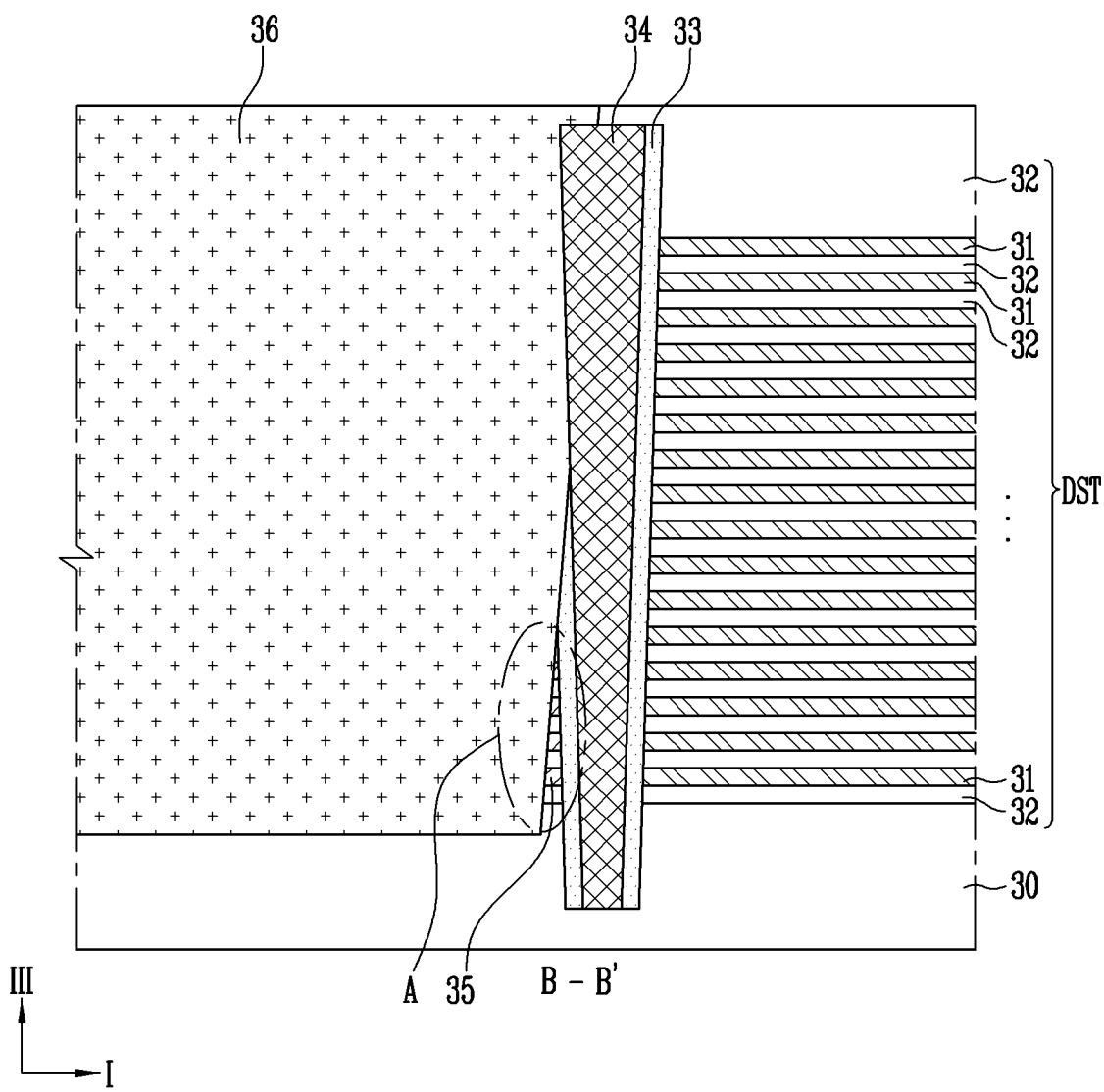

FIGS. 4A to 4C are sectional views illustrating a manufacturing method of the semiconductor device, and are sectional views corresponding to a section taken along line B-B' shown in FIG. 3. Hereinafter, descriptions of contents overlapping with those described above will be omitted.

Referring to FIG. 4A, a stack structure ST including sacrificial layers 31 and insulating layers 32, which are alternately stacked, is formed on a base 30. Subsequently, a conductive plug 34 penetrating the stack structure and an insulating spacer 33 surrounding a sidewall of the conductive plug 34 are formed according to well-known processes. For example, a mask layer may be formed over the stack structure ST leaving exposed an area where a hole is to be formed, then the hole may be formed by etching followed by forming the insulating spacer 33 conformally on the sidewall of the hole. The conductive plug 34 may then be formed by filling the core of the hole with a suitable conductive material.

Referring to FIG. 4B, following the formation of the conductive plug 34 and the insulating spacer 33, a mask pattern 37 may be formed on the stack structure ST. The mask pattern 37 may include an opening that exposes a region in which a slit is to be formed, a portion of the insulating spacer 33, and a portion of the conductive plug 34. Subsequently, a slit SL is formed by etching the stack structure ST, using the mask pattern 37 as an etch barrier.

In the process of etching the stack structure ST, the insulating spacer 33 is etched together with the stack structure ST, and the conductive plug 34 is exposed. However, the conductive plug 34 is not etched, and may be used together with the mask pattern 37 as an etch barrier. In addition, since the conductive plug 34 has a shape of which width is narrowed toward the bottom thereof, the periphery of a lower portion of the conductive plug 34 may be masked, and be relatively less exposed to an etching environment. Therefore, the sacrificial layers 31 and the insulating layers 32 may remain at the periphery of the lower portion of the conductive plug 34 (see reference numeral "A").

Referring to FIG. 4C, the sacrificial layers 31 are replaced with conductive layers 35 through the slit SL. Although the sacrificial layers 31 in a region close to the slit SL are replaced with the conductive layers 35, the sacrificial layers 31 in a region spaced apart from the slit SL may remain. The region in which the sacrificial layers 31 remain may become a dummy stack structure DST. In addition, one side of the slit SL may become a first stack structure ST1, and the other side of the slit SL may become a second stack structure ST2. Subsequently, a slit insulating layer 36 is formed in the slit SL.

According to the manufacturing method described above, the slit SL is formed to overlap with the conductive plug 34 and the insulating spacer 33, so that the conductive plug 34 and the insulating layer 36 can be connected to each other. Further, the first stack structure ST1 and the second stack structure ST2 can be separated from each other by the conductive plug 34, the insulating spacer 33, the slit insulating layer 36, and the dummy stack structure DST.

In the process of replacing the sacrificial layers 31 with the conductive layer 35, the sacrificial layers 31 remaining in the region A may also be replaced with the conductive layers 35. The remaining conductive layers 35 may be connected to first conductive layers 35A included in the first stack structure ST1 and second conductive layers 35B included in the second stack structure ST2.

Figure 5A:
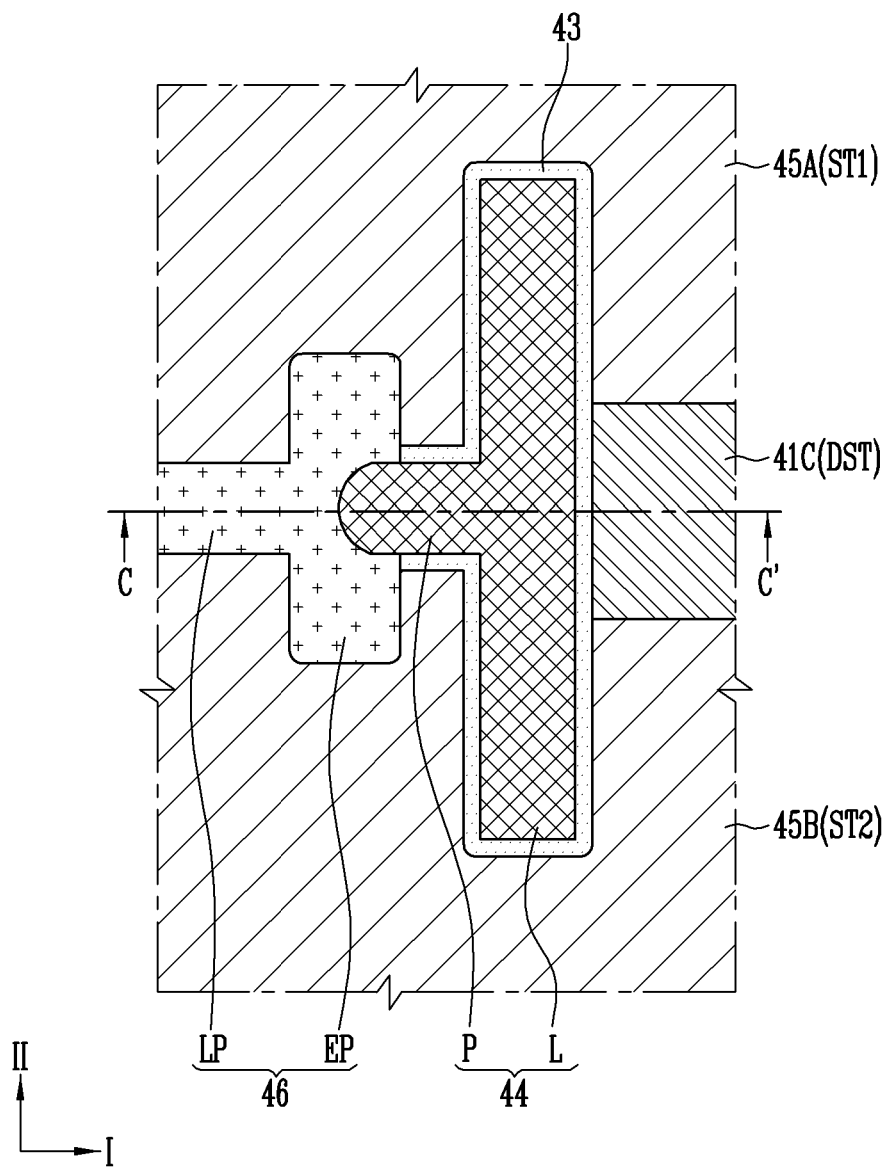
FIGS. 5A and 5B are layouts illustrating a structure of a semiconductor memory device in accordance with an embodiment of the present disclosure.
Figure 5B:
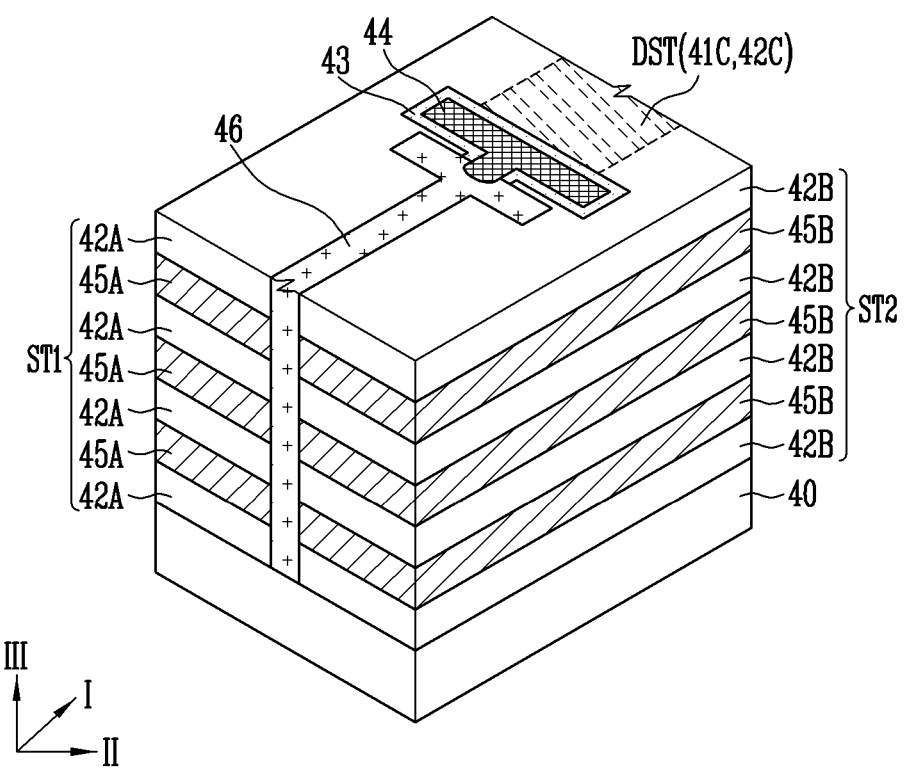

FIGS. 5A and 5B are layouts illustrating a structure of a semiconductor memory device in accordance with an embodiment of the present disclosure. Hereinafter, descriptions of contents overlapping with those described above will be omitted.

Referring to FIGS. 5A and 5B, the semiconductor device in accordance with an embodiment of the present disclosure includes a first stack structure ST1, a second stack structure ST2, a slit insulating layer 46, a conductive plug 44, an insulating spacer 43, and a dummy stack structure DST.

The first stack structure ST1 may include first conductive layers 45A and first insulating layers 42A, which are alternately stacked in the third direction III. The second stack structure ST2 may include second conductive layers 45B and second insulating layers 42B, which are alternately stacked in the third direction III. The dummy stack structure DST may include third insulating layers 41C and fourth insulating layers 42C, which are alternately stacked in the third direction III. A first insulating layer 42A, a second insulating layer 42B, and a fourth insulating layer 42C, which are located at a same level, may constitute one layer in which the first insulating layer 42A, the second insulating layer 42B, and the fourth insulating layer 42C are connected to each other. In addition, the first conductive layers 45A and the second conductive layers 45B may be electrically separated from each other by the slit insulating layer 46, the conductive plug 44, the insulating spacer 43, and the dummy stack structure DST.

The conductive plug 44 may include a protrusion part P that extends in a first direction I and protrudes to the inside of the slit insulating layer 46. For example, the conductive plug 44 may include a line pattern L extending in a second direction II and the protrusion part P protruding in the first direction I from the line pattern L. The protrusion part P may be protruding in the first direction I from a center region of the line pattern L. The conductive plug 44 may have a T shape on a plane defined by the first direction I and the second direction II. The slit insulating layer 46 may include a line pattern LP extending in the first direction I, and an end pattern EP. The end pattern EP may be a part of the line pattern LP. More specifically, the end pattern EP may be an end portion of the line pattern LP. The end pattern EP may overlap with the protrusion part P. That is, the protrusion part P may protrude to the inside of the end pattern EP. The end pattern EP and the line pattern LP may form T shape on a plane defined by the first direction I and the second direction II. The end pattern EP may have a line shape extending in the second direction II. The size of the end pattern EP in the second direction II may be larger than the size of the line pattern LP in the second direction II. Thus, although a size of the protrusion part P in the second direction II is wider than that of the line pattern LP in the second direction II, an overlapping margin can be secured between the protrusion part P of the conductive plug 44 and the slit insulating layer 46. The size of the end pattern EP in the second direction II may be smaller than the size of the line pattern L in the second direction II.

The insulating spacer 43 may be formed to surround a sidewall of the conductive plug 44 except for the sidewall of the first protrusion part P of the conductive plug 44 which protrudes inside the slit insulating layer 46. The conductive plug 44 and the first and second conductive layers 45A and 45B may be insulated from each other.

Figure 6A:
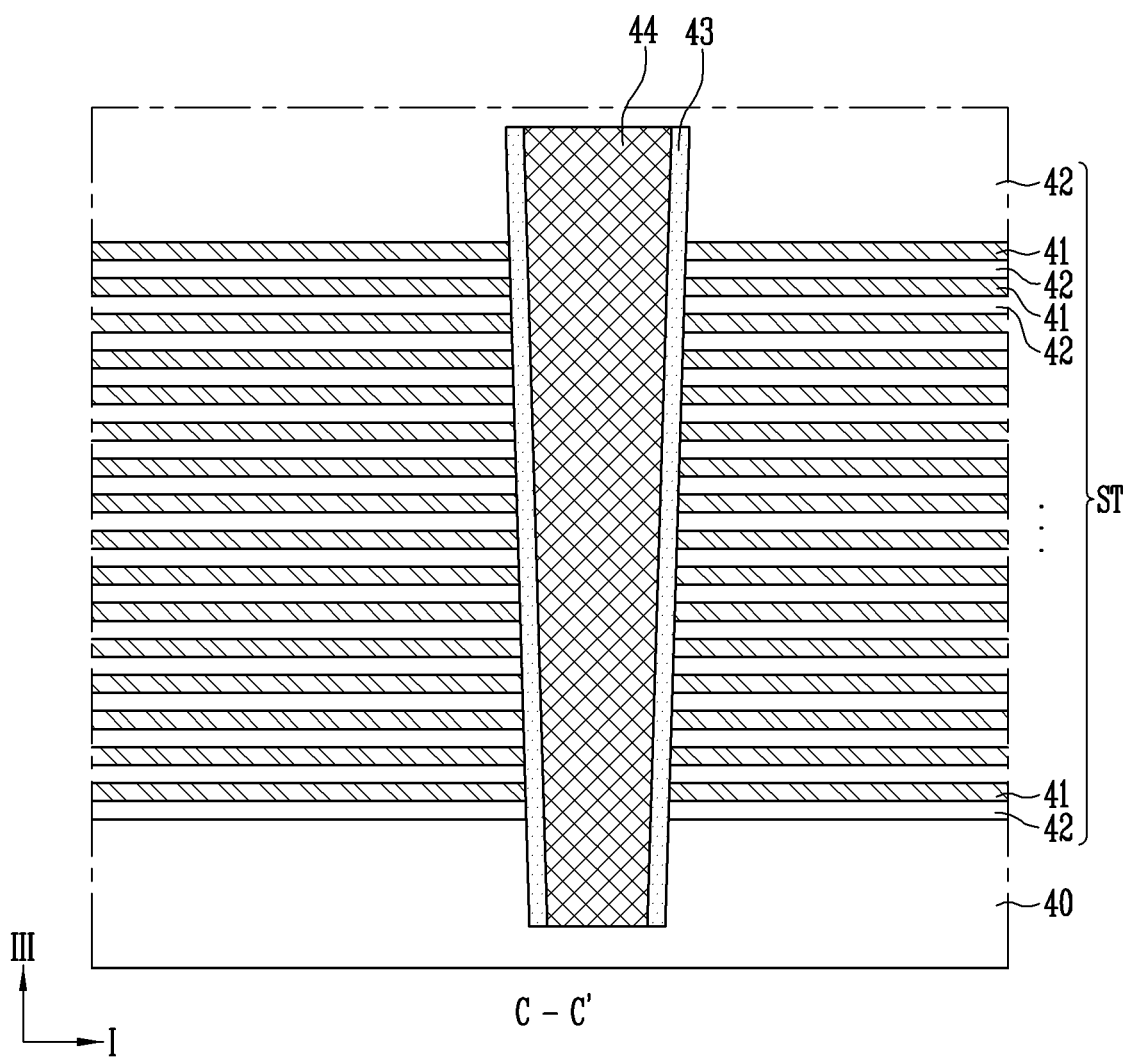
FIGS. 6A to 6C are sectional views illustrating a manufacturing method of a semiconductor device.
Figure 6B:
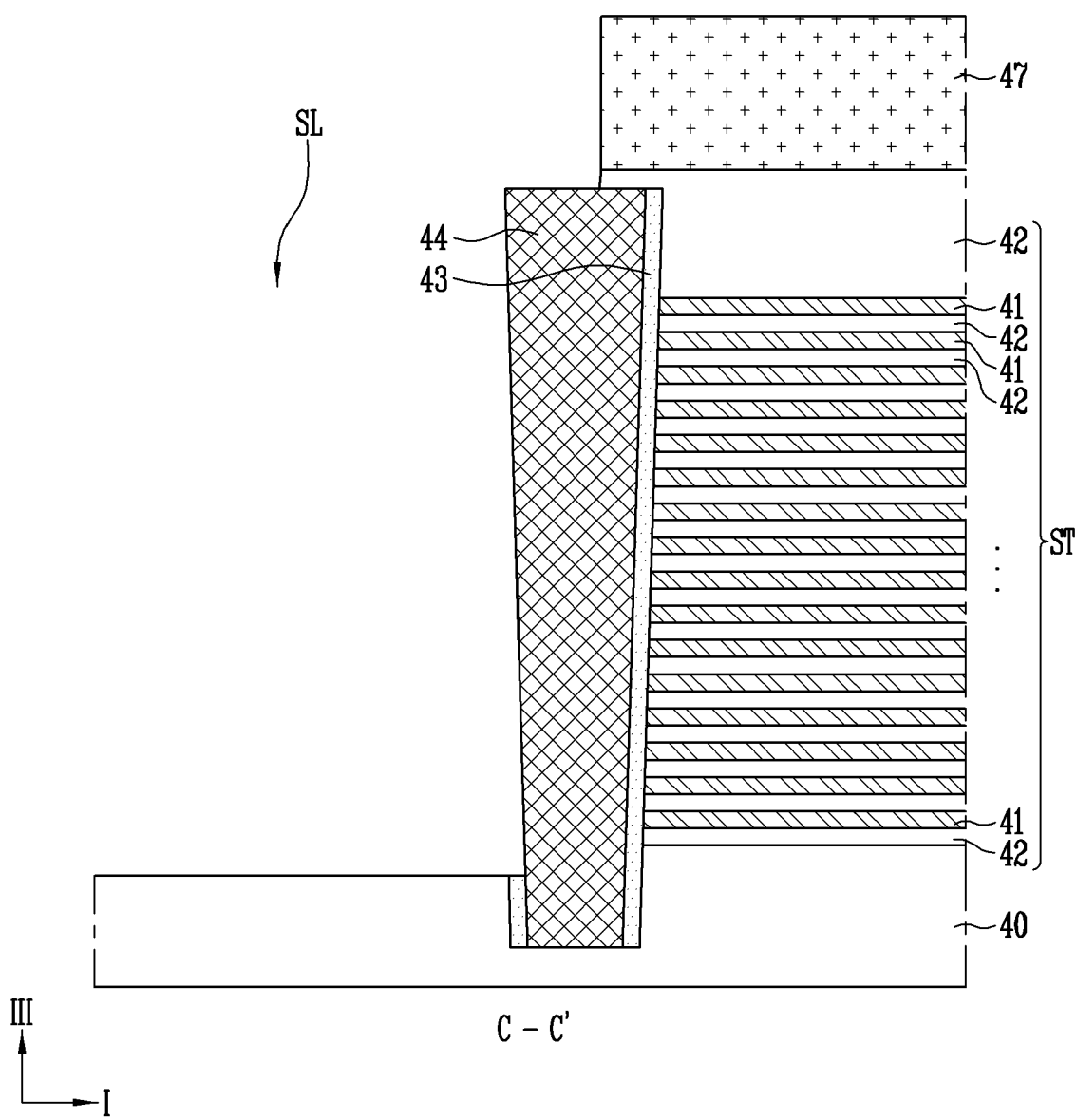
Figure 6C:
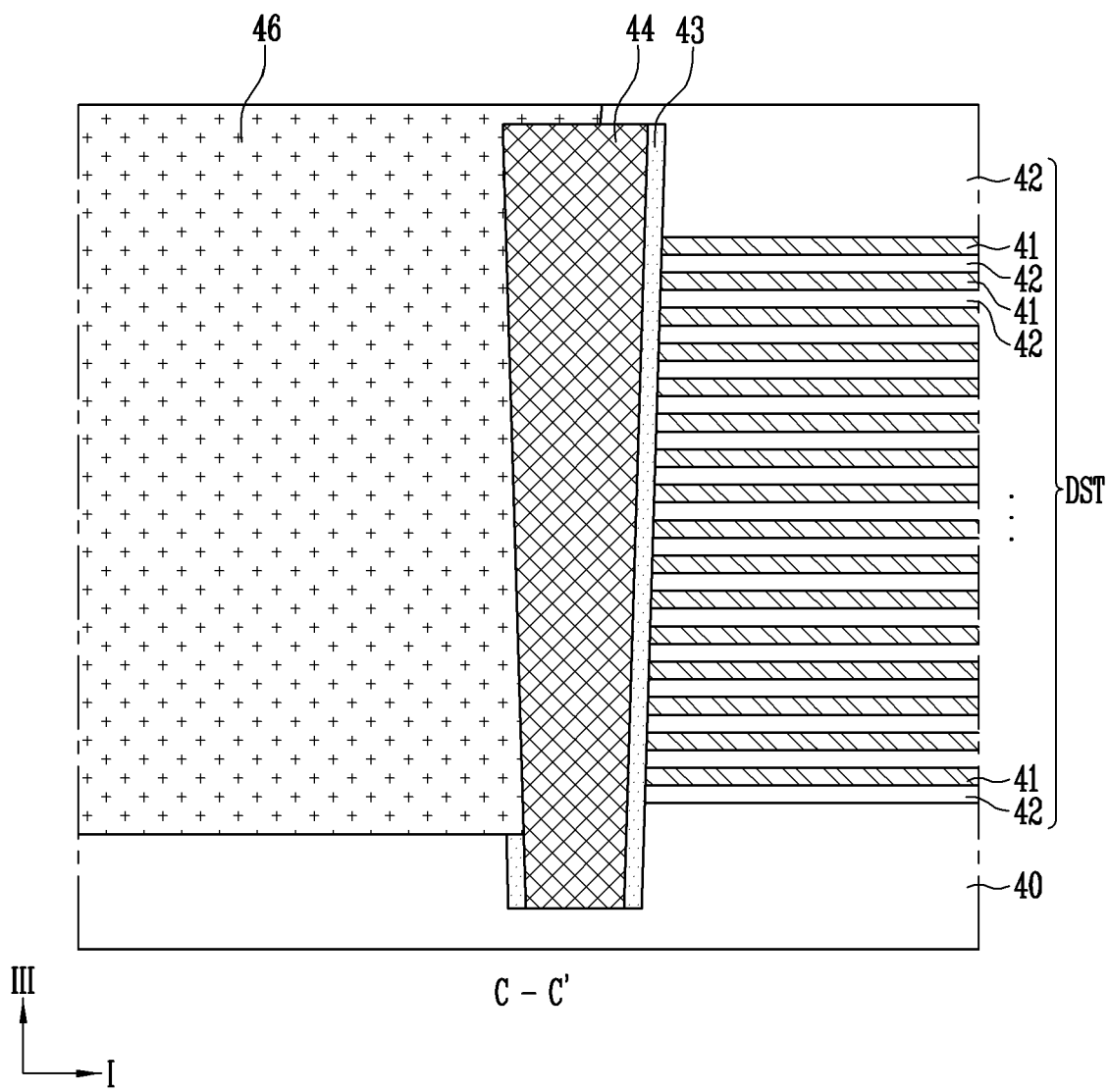

FIGS. 6A to 6C are sectional views illustrating a manufacturing method of the semiconductor device, and are sectional views corresponding to a section taken along line C-C' shown in FIG. 5A. Hereinafter, descriptions of contents overlapping with those described above will be omitted.

Referring to FIG. 6A, a stack structure ST including first material layers 41 and second materials 42 is formed on a base 40. The base 40 may be a source layer or be a sacrificial layer for forming the source layer. Although not shown in the drawing, a lower structure may be formed before the stack structure ST is formed. For example, the peripheral circuit, the interconnection structure, and the like, which are described with reference to FIG. 1B, may be formed. Alternatively, a peripheral circuit, an interconnection structure, and the like may be formed on a separate substrate, and a substrate on which a cell array is formed may be bonded to the substrate on which the peripheral circuit is formed.

The first material layers 41 may be used to form gate electrodes of a memory cell, a select transistor, and the like, and the second material layers 42 may be used to insulate the stacked gate electrodes from each other.

The first material layers 41 are formed of a material having a high etch selectivity with respect to the second material layers 42. Although a case where the first material layers 41 are sacrificial layers and the second material layers 42 are insulating layers is illustrated in the drawing, the present disclosure is not limited thereto. In an example, the first material layers 41 may be sacrificial layers including nitride, and the like, and the second material layers 42 may be insulating layers including oxide, and the like. In another example, the first material layers 41 may be conductive layers including polysilicon, tungsten, and the like, and the second material layers 42 may be insulating layers including oxide, and the like. In still another example, the first material layers 41 may be conductive layers including doped polysilicon, and the like, and the second material layers 42 may be sacrificial layers including undoped polysilicon, and the like.

Subsequently, a conductive plug 44 and an insulating spacer 43, which penetrate the stack structure ST, are formed. For example, after an opening penetrating the stack structure ST is formed, the insulating spacer 43 is formed in the opening. Subsequently, the conductive plug 44 is formed in the opening. Subsequently, the second material layer 42 may be additionally formed on an intermediate resultant structure in which the conductive plug 44 is formed. Accordingly, the conductive plug 44 and the insulating spacer 43 surrounding a sidewall of the conductive plug 44 are formed. The conductive plug 44 may have a tapered shape with a cross sectional area which is gradually reduced toward the bottom thereof located inside the base 40. For example, a cross section of the conductive plug 44 in a plane defined by the first direction I and the third direction III may have an isosceles trapezoidal shape with the small base being the one inside the base 40.

Referring to FIG. 6B, a mask pattern 47 is formed on the stack structure ST. The mask pattern 47 may include an opening that exposes a region in which a slit is to be formed, a portion of the insulating spacer 43, and a portion of the conductive plug 44. Subsequently, a slit SL is formed by etching the stack structure ST, using the mask pattern 47 as an etch barrier. In the process of etching the stack structure ST, the insulating spacer 43 is etched together with the stack structure ST, and the conductive plug 44 is exposed. However, the conductive plug 44 is not etched, and may be used together with the mask pattern 47 as an etch barrier.

Etching at the periphery of the protrusion part P may be activated by the protrusion part P protruding to the inside of the slit SL. Although a masked region exists due to a decrease in width of the conductive plug 44, the masked region is further exposed to an etching environment by the protrusion part P. Thus, the first material layers 41 and the second material layers 42, which remain at the periphery of a lower portion of the conductive plug 44, can be minimized. In addition, since the protrusion part P protrudes to the inside of the slit insulating layer 46, electrical disconnection is possible even when the first material layers 41 and the second material layers 42 remain at the periphery of the protrusion part P.

Referring to FIG. 6C, the first material layers 41 or the second material layers 42 are replaced with third material layers (not shown) through the slit SL. In an example, when the first material layers 41 are sacrificial layers and the second material layers 42 are insulating layers, first, openings are formed by removing the first material layers 41. The conductive plug 44 may be used as a support for supporting the second material layers 42. Subsequently, the third material layers are formed in the openings. Accordingly, the first material layers 41 may be replaced with the conductive layers 45A and 45B, and a dummy stack structure DST may be formed using remaining first material layer 41. In another example, when the first material layers 41 are conductive layers and the second material layers 42 are insulating layers, the first material layers 41 are silicided. In still another example, when the first material layers 41 are conductive layers and the second material layers 42 are sacrificial layers, the second material layers 42 are replaced with insulating layers.

Subsequently, a slit insulating layer 46 is formed in the slit SL. The slit insulating layer 46 may be formed of or include an insulating material such as oxide.

According to the manufacturing method described above, the slit SL is formed to overlap with the conductive plug 44 and the insulating spacer 43, so that the conductive plug 44 and the slit insulating layer 46 can be connected to each other. Further, the first stack structure ST1 and the second stack structure ST2 can be separated from each other by the conductive plug 44, the insulating spacer 43, the slit insulating layer 46, and the dummy stack structure DST.

In addition, the conductive plug 44 may be formed together with the first contact plug 13 described with reference to FIGS. 1A to 1C when the first contact plug 13 is formed, or be formed together with the supporting plug 17 described with reference to FIGS. 1A to 1C when the supporting plug 17 is formed. Alternatively, the first contact plug 13, the supporting plug 17, and the conductive plug 44 may be formed together. The insulating spacer may be formed even on a sidewall of the first contact plug 13.

Figure 7A:
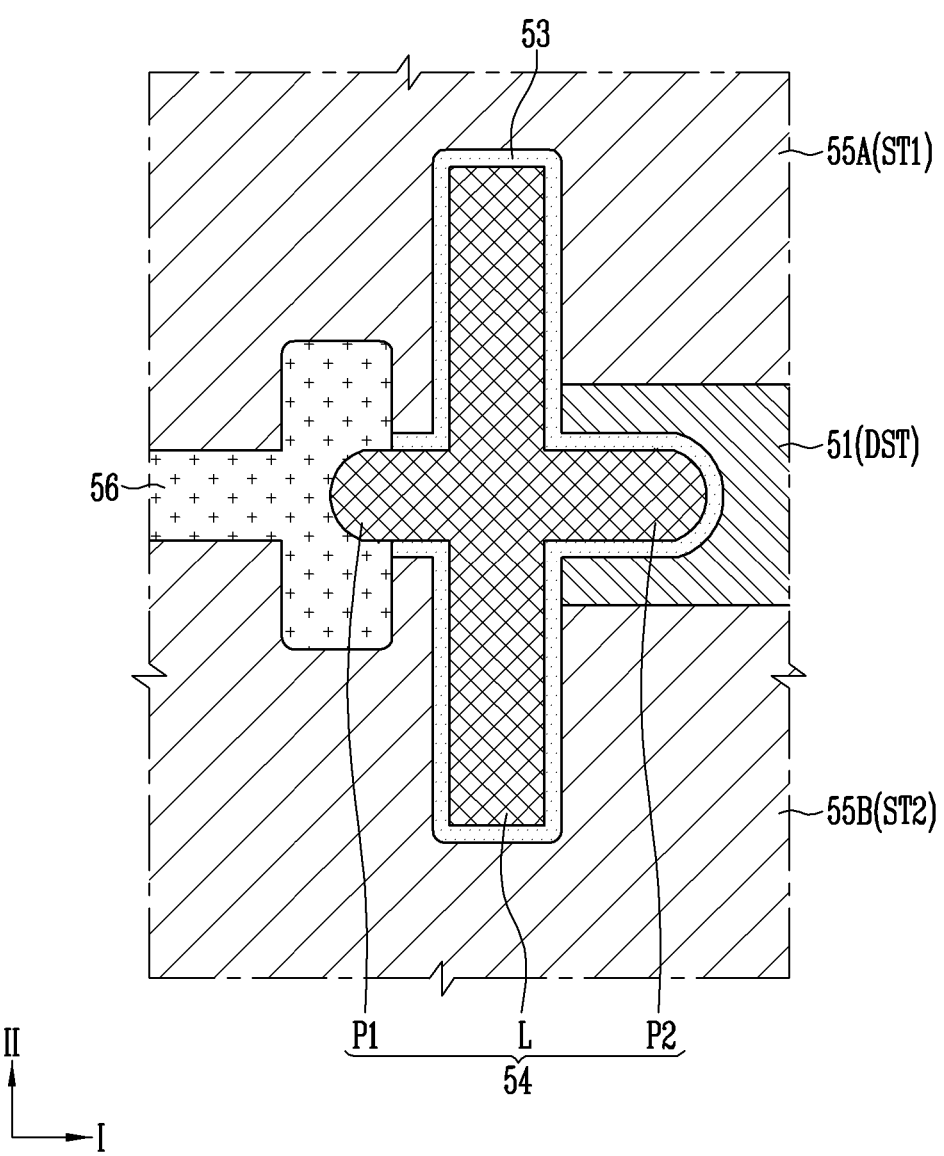
FIGS. 7A and 7B are views illustrating a structure of a semiconductor device in accordance with an embodiment of the present disclosure.
Figure 7B:
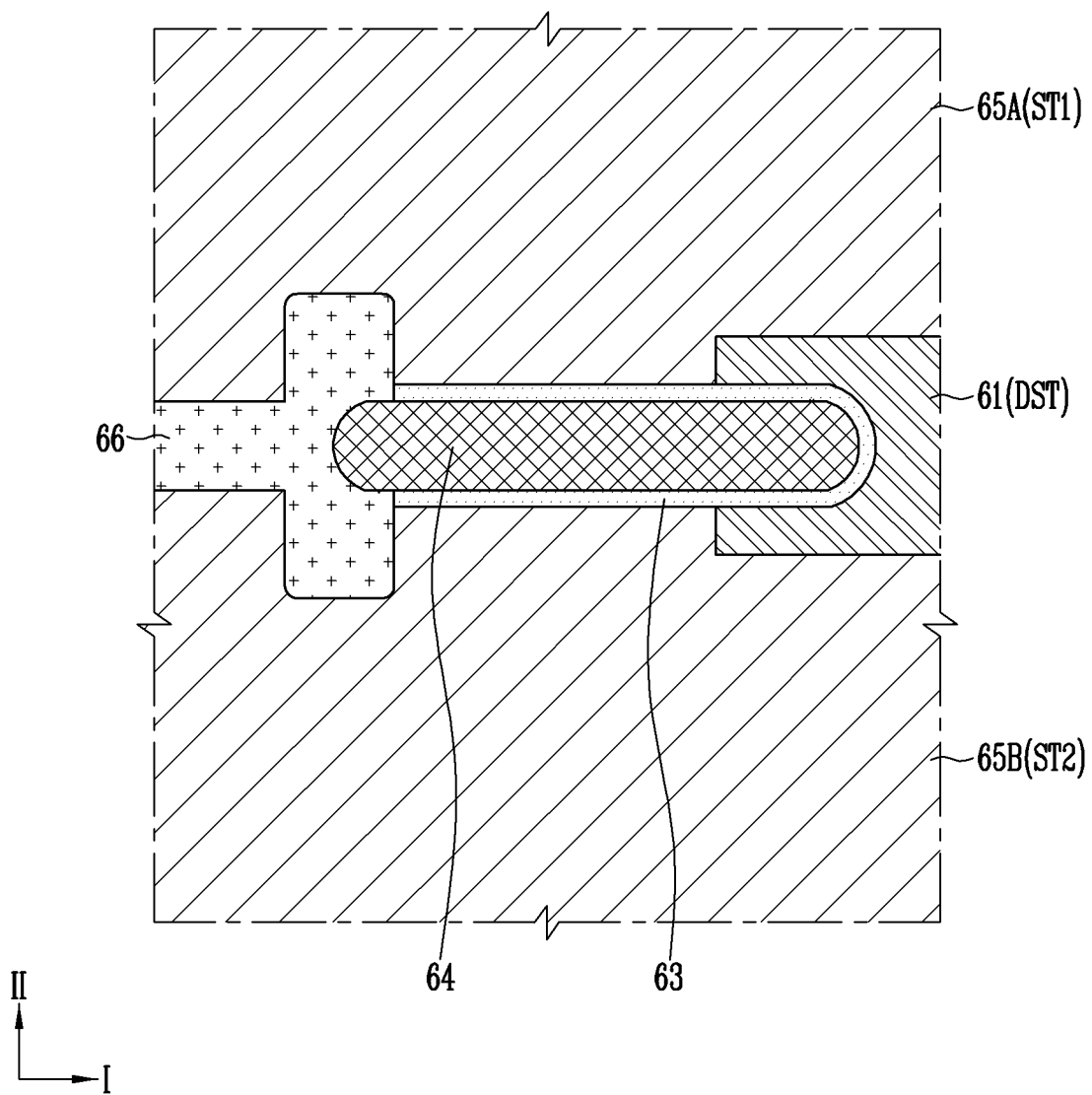

FIGS. 7A and 7B are views illustrating a structure of a semiconductor device in accordance with an embodiment of the present disclosure. Hereinafter, descriptions of contents overlapping with those described above will be omitted.

Referring to FIGS. 7A and 7B, the semiconductor device in accordance with an embodiment of the present disclosure includes a first stack structure ST1, a second stack structure ST2, a slit insulating layer 56 or 66, a conductive plug 54 or 64, an insulating spacer 53 or 63, and a dummy stack structure DST. The first stack structure ST1 may include stacked first conductive layers 55A or 65A, the second stack structure ST2 may include stacked second conductive layers 55B or 65B, and the dummy stack structure DST may include stacked insulating layers 51 or 61.

Referring to FIG. 7A, the conductive plug 54 may include a first protrusion part P1, a second protrusion part P2, and a line pattern L. The line pattern L may extend in a second direction II. The first protrusion part P1 and the second protrusion part P2 may protrude in a first direction I from the line pattern L. The first protrusion part P1 and the second protrusion part P2 may protrude in a first direction I from a center region of the line pattern L. The first protrusion part P1 and the second protrusion part P2 may extend in the first direction at opposite sides of the line pattern L. The first protrusion part P1 and the second protrusion part P2 may be symmetrically located at both the sides of the line pattern L. The first protrusion part P1 and the second protrusion part P2 may be asymmetrically located at both the sides of the line pattern L. The first protrusion part P1 may protrude to the inside of the slit insulating layer 56. The second protrusion part P2 may protrude to the inside of the dummy stack structure DST. The conductive plug 54 may have a cross shape on a plane defined by the first direction I and the second direction II. The size of the protrusions P1 and P2 may be the same or different in the first direction I.

The insulating spacer 53 may be formed to surround a sidewall of the conductive plug 54 except a region overlapping with the slit insulating layer 56. For example, the insulating spacer 53 surrounds sidewalls of the second protrusion part P2 and the line pattern L, and only a portion of the first protrusion part P1 which does not protrude inside the slit insulating layer 56. The insulating spacer 53 may be formed to expose a sidewall of the first protrusion part P1 which protrudes inside the slit insulating layer 56. Accordingly, the conductive plug 54 and the first and second conductive layers 55A and 55B can be insulated from each other.

Referring to FIG. 7B, the conductive plug 64 may include a line pattern extending in the first direction I. One end of the line pattern may protrude to the inside of the slit insulating layer 56, and the other end of the line pattern may protrude to the inside of the dummy stack structure DST. The conductive plug 64 may have a line shape on a plane defined by the first direction I and the second direction II.

The insulating spacer 63 may be formed to surround the other region except a region overlapping with the slit insulating layer 66 in a sidewall of the conductive plug 64. For example, the insulating spacer 63 surrounds a sidewall of the line pattern, and may be formed to expose one end of the line pattern. Accordingly, the conductive plug 64 and the first and second conductive layers 65A and 65B can be insulated from each other.

Figure 8A:
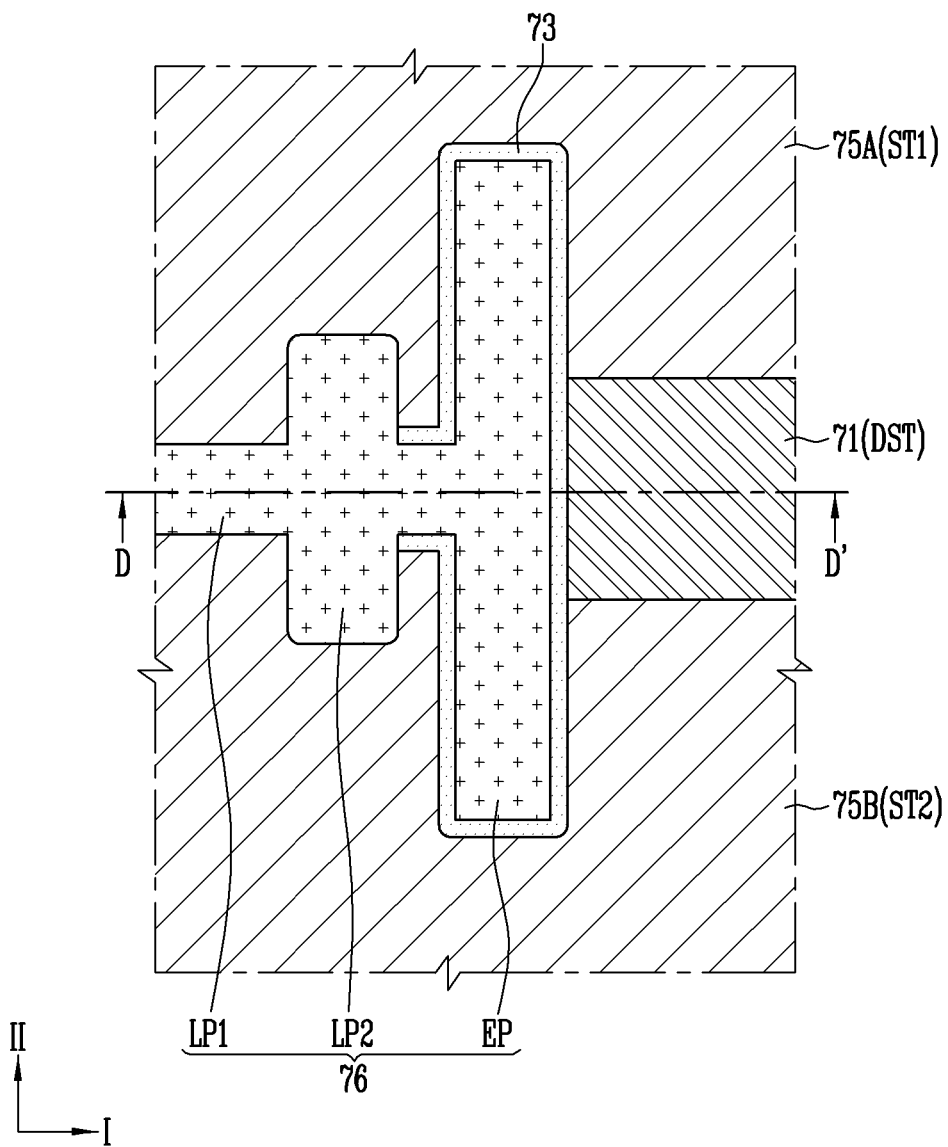
FIGS. 8A and 8B are layouts illustrating a structure of a semiconductor device in accordance with an embodiment of the present disclosure.
Figure 8B:
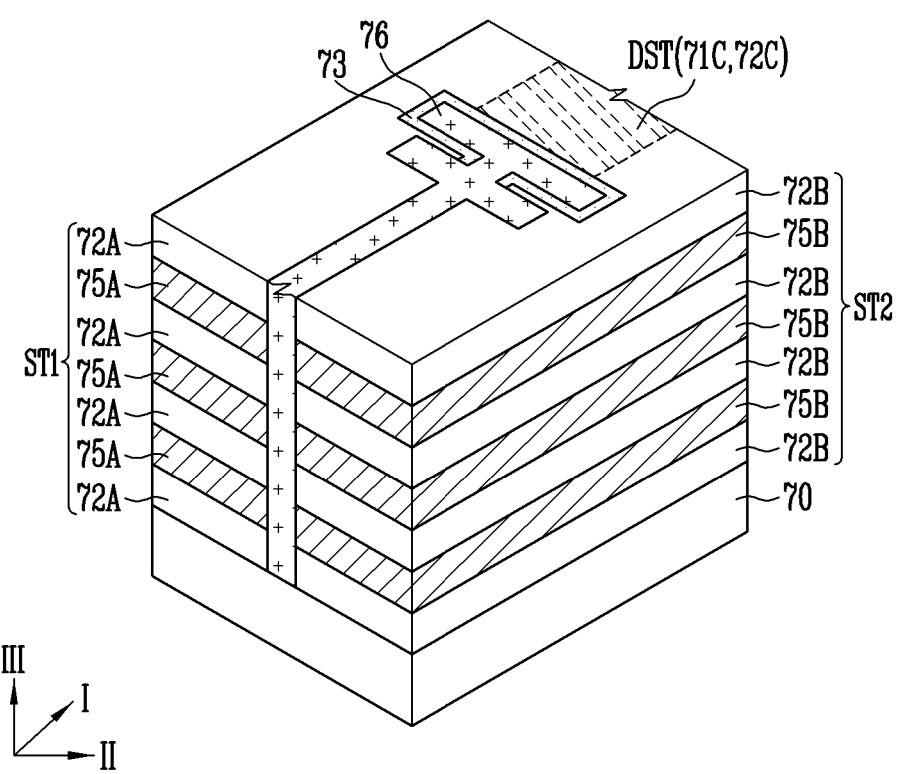

FIGS. 8A and 8B are layouts illustrating a structure of a semiconductor device in accordance with an embodiment of the present disclosure. Hereinafter, descriptions of contents overlapping with those described above will be omitted.

Referring to FIGS. 8A and 8B, the semiconductor device in accordance with an embodiment of the present disclosure includes a first stack structure ST1, a second stack structure ST2, a slit insulating layer 76, an insulating spacer 73, and a dummy stack structure DST.

The first stack structure ST1 may include first conductive layers 75A and first insulating layers 72A, which are alternately stacked in the third direction III. The second stack structure ST2 may include second conductive layers 75B and second insulating layers 72B, which are alternately stacked in the third direction III. The dummy stack structure DST may include third insulating layers 71C and fourth insulating layers 72C, which are alternately stacked in the third direction III. A first insulating layer 72A, a second insulating layer 72B, and a fourth insulating layer 72C, which are located at a same level, may constitute one layer in which the first insulating layer 72A, the second insulating layer 72B, and the fourth insulating layer 72C are connected to each other. In addition, the first conductive layers 75A and the second conductive layers 75B may be electrically separated from each other by the slit insulating layer 76, the insulating spacer 73, and the dummy stack structure DST.

The slit insulating layer 76 may include a first line pattern LP1 extending in a first direction I, a second line pattern LP2 extending in a second direction II and an end pattern EP. The end pattern EP may have a line shape extending in the second direction II. The end pattern EP may have a size larger in the second direction II than that of the first line pattern LP1 and also the second line pattern LP2 in the second direction II. For example, the end pattern EP together with the first line pattern LP1 may form a T shape on a plane defined by the first direction I and the second direction II. In addition, a size of the second line pattern LP2 in the second direction II may be smaller than that of the end pattern EP in the second direction II. The second line pattern LP2 together with the first line pattern LP1 may form a cross shape.

The insulating spacer 73 may be formed to surround the end pattern EP of the slit insulating layer 76 and also the sidewall of the first line pattern LP1 which is between second line pattern LP2 and the end pattern EP and may expose the remaining sidewall of the slit insulating layer 76. The insulating spacer 73 may be interposed between the insulating spacer 73 and the dummy stack structure DST, and the insulating spacer 73 and the dummy stack structure DST may be in direct contact with each other.

FIGS. 9A to 9D are sectional views illustrating a manufacturing method of a semiconductor device, and are sectional views corresponding to a section taken along line D-D' shown in FIG. 8A. Hereinafter, descriptions of contents overlapping with those described above will be omitted.

Figure 9A:
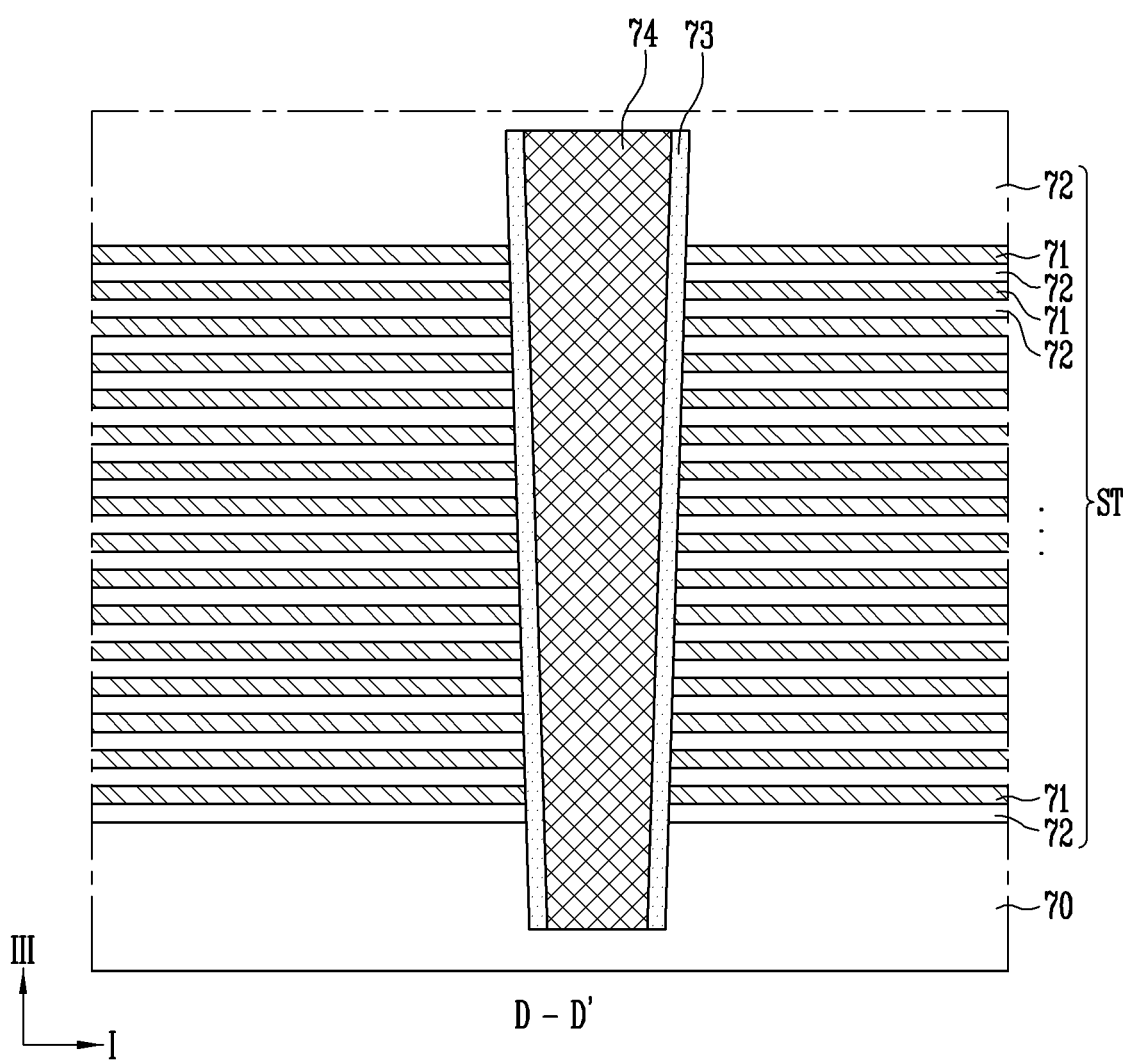

Referring to FIG. 9A, a stack structure ST including first material layers 71 and second material layers 72, which are alternately stacked, is formed on a base 70. Subsequently, a conductive plug 74 and an insulating spacer 73, which penetrate the stack structure ST, are formed. The conductive plug 74 may be formed together with the first contact plugs 13 and/or the supporting plugs 17, which are described with reference to FIGS. 1A to 1C, when the first contact plugs 13 and/or the supporting plugs 17 are formed.

Referring to FIG. 9B, a mask pattern 77 is formed on the stack structure ST. The mask pattern 77 may include an opening that exposes a region in which a slit is to be formed, a portion of the insulating spacer 73, and a portion of the conductive plug 74. Subsequently, a slit SL is formed by etching the stack structure ST, using the mask pattern 77 as an etch barrier. In the process of etching the stack structure ST, the insulating spacer 73 is etched together with the stack structure ST, and the conductive plug 74 is exposed.

Figure 9C:
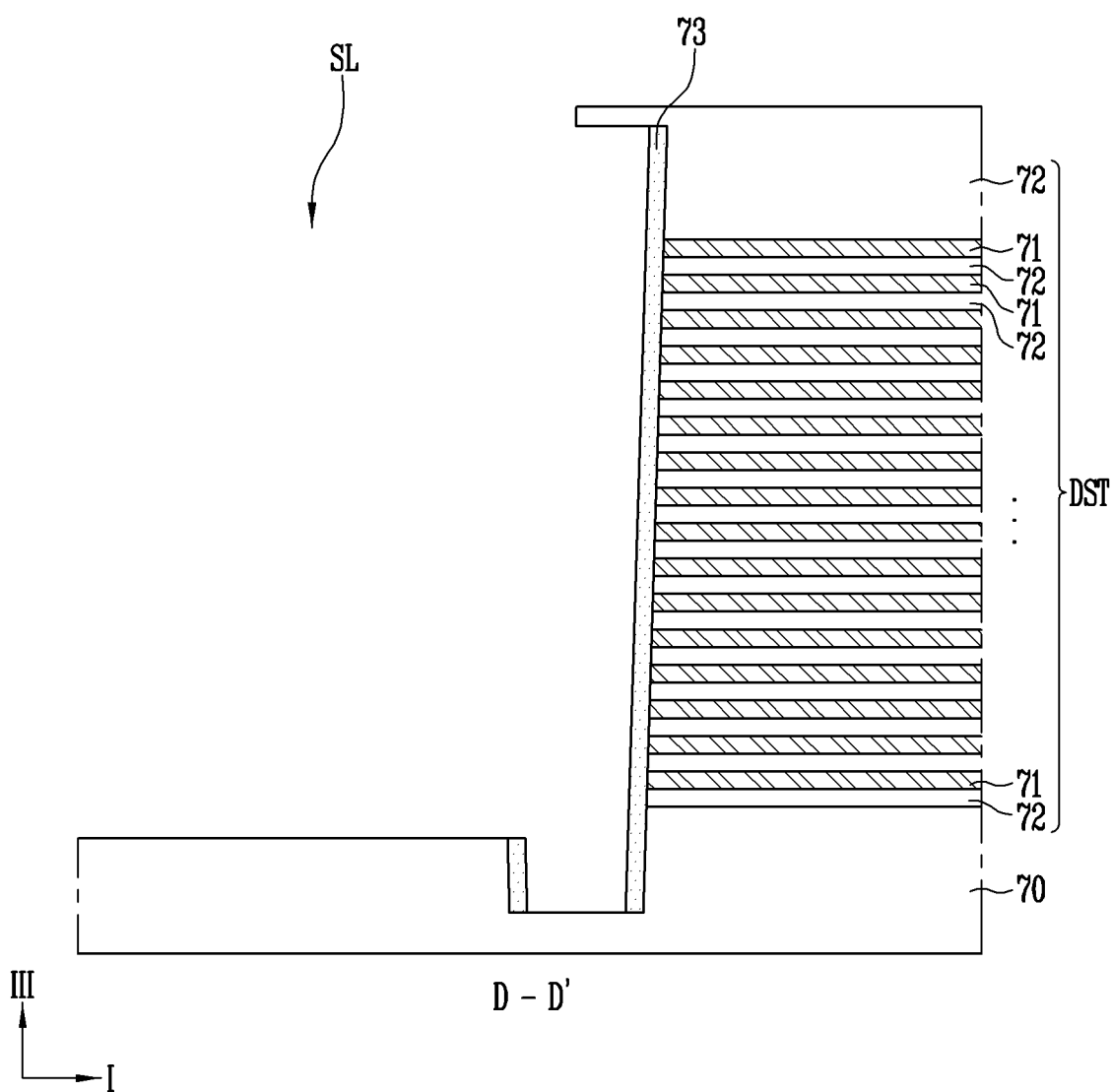

Referring to FIG. 9C, the first material layers 71 or the second material layers 72 are replaced with third material layers (not shown) through the slit SL. Remaining first material layers 71 form a dummy stack structure DST.

Figure 9D:
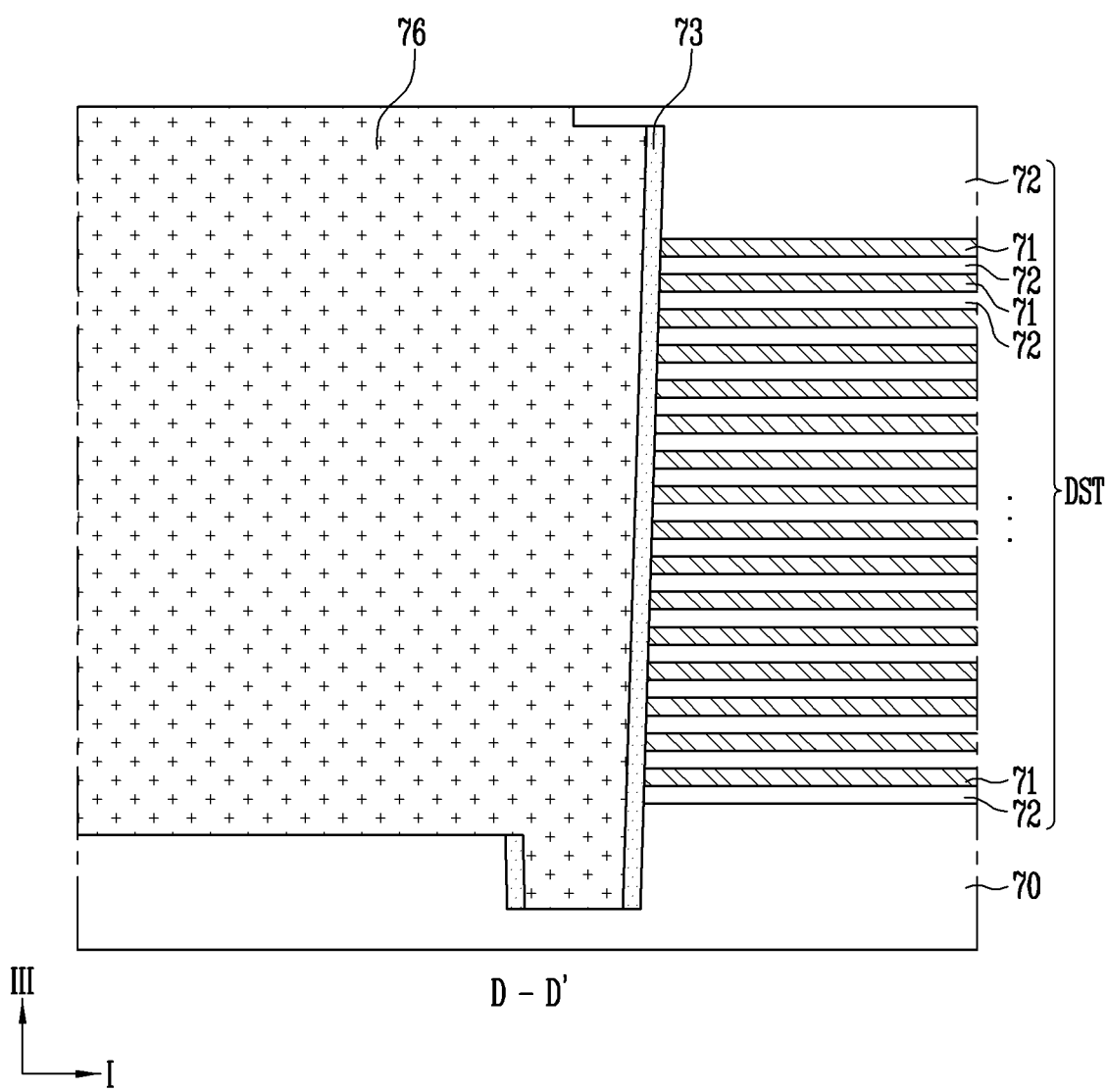

Referring to FIG. 9D, after the conductive plug 74 is removed through the slit SL, a slit insulating layer 76 is formed in the slit SL. The slit insulating layer 76 may be formed of or include an insulating material such as oxide. In addition, the conductive plug 74 may be removed using a wet etching process.

According to the manufacturing method described above, after the conductive plug 74 is removed, the slit insulating layer 76 is formed. Thus, the first stack structure ST1 and the second stack structure ST2 can be separated from each other by the insulating spacer 73, the slit insulating layer 76, and the dummy stack structure DST.

Meanwhile, after the slit insulating layer 76 is formed in a spacer shape, a conductive layer may be filled in the slit SL. The conductive plug 15A and the insulating spacer 16A, which are described with reference to FIG. 1C, may be formed. Before the spacer-shaped slit insulating layer 76 is formed, the insulating spacer 73 may be removed.

Figure 10A:
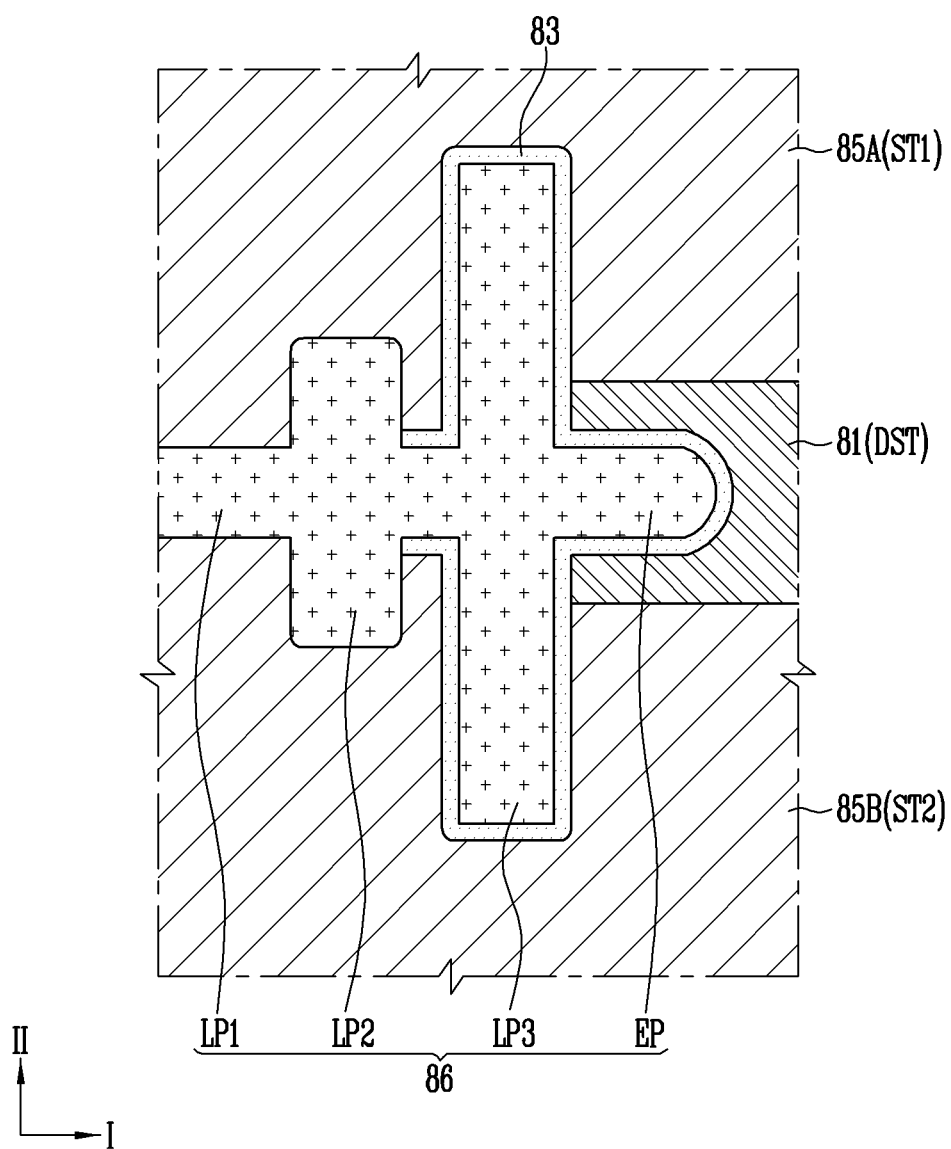
FIGS. 10A and 10B are views illustrating a structure of a semiconductor device in accordance with an embodiment of the present disclosure.
Figure 10B:
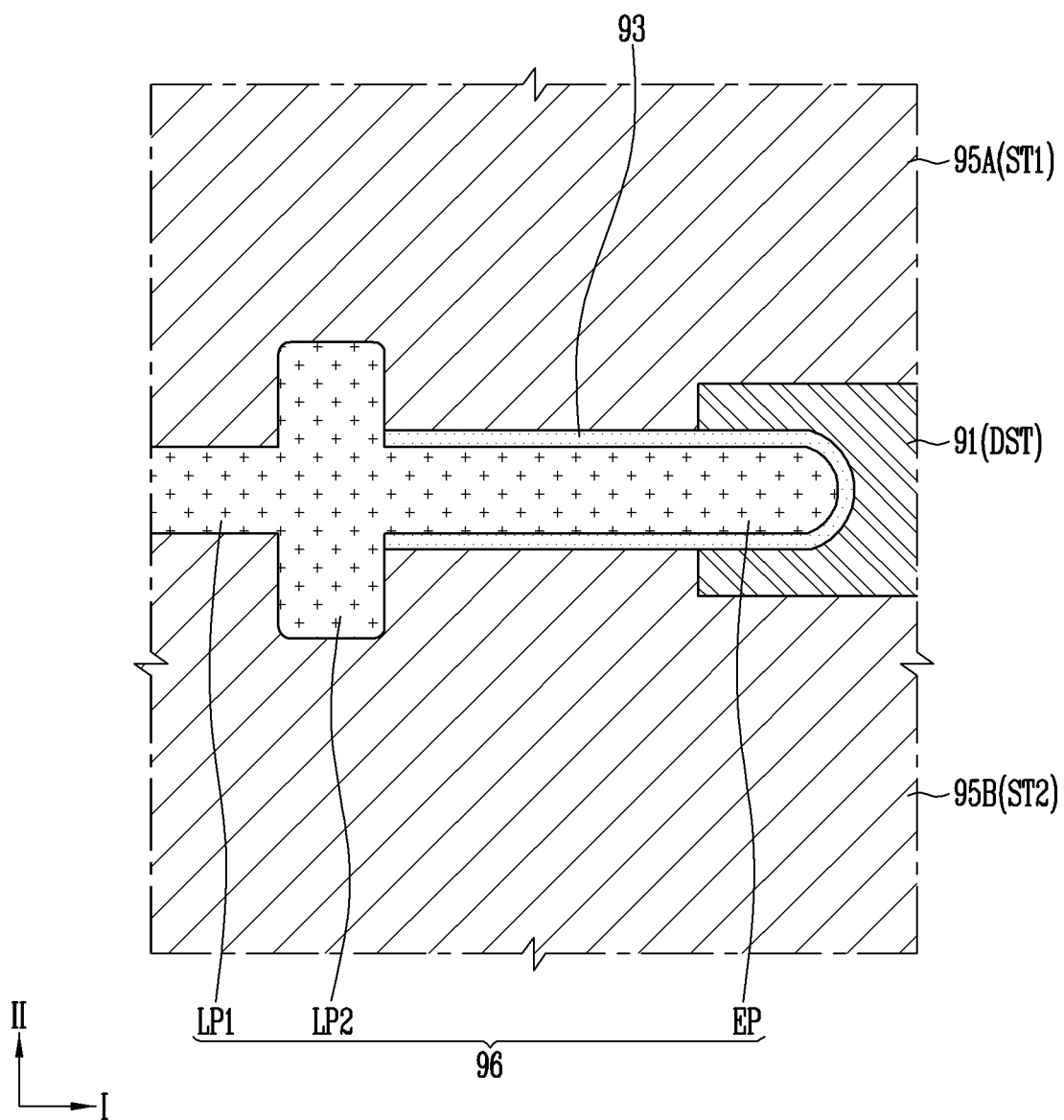

FIGS. 10A and 10B are views illustrating a structure of a semiconductor device in accordance with an embodiment of the present disclosure. Hereinafter, descriptions of contents overlapping with those described above will be omitted.

Referring to FIGS. 10A and 10B, the semiconductor device in accordance with an embodiment of the present disclosure includes a first stack structure ST1, a second stack structure ST2, a slit insulating layer 86 or 96, an insulating spacer 83 or 93, and a dummy stack structure DST. The first stack structure ST1 may include stacked first conductive layers 85A or 95A, the second stack structure ST2 may include stacked second conductive layers 85B or 95B, and the dummy stack structure DST may include stacked insulating layers 81 or 91.

Referring to FIG. 10A, the slit insulating layer 86 may include a first line pattern LP1, a second line pattern LP2, and a third line pattern LP3. The first line pattern LP1 may extend in a first direction I, and the second line pattern LP2 and the third line pattern LP3 may extend in the second direction II. The third line pattern LP3 may be located between an end pattern EP of the first line pattern LP1 and the second line pattern LP2. A size of the second line pattern LP2 in the second direction II may be smaller than that of the third line pattern LP3 in the second direction II. In addition, the end pattern EP of the first line pattern LP1 may protrude to the inside of the dummy stack structure DST.

The insulating spacer 83 may be formed to surround the end pattern EP, the third line pattern LP3 and the sidewall of the first line pattern LP1 between the second and third line patterns LP2, LP3, and expose the remaining region of the first line pattern LP1 and the second line pattern LP2.

Referring to FIG. 10B, the slit insulating layer 96 includes a first line pattern LP1 and a second line pattern LP2. The first line pattern LP1 may extend in the first direction I, and the second line pattern LP2 may extend in the second direction II. An end pattern EP of the first line pattern LP1 may protrude to the inside of the dummy stack structure DST.

The insulating spacer 93 may be formed to surround the end pattern EP of and expose the other region of the slit insulating layer 96. For example, the insulating spacer 93 may be formed to surround the end pattern EP of the first line pattern LP1 and expose the other region of the first line pattern LP1 and the second line pattern LP2.

FIGS. 11A to 11D are views illustrating modifications of a conductive plug and a slit insulating layer in accordance with embodiments of the present disclosure.

Figure 11A:
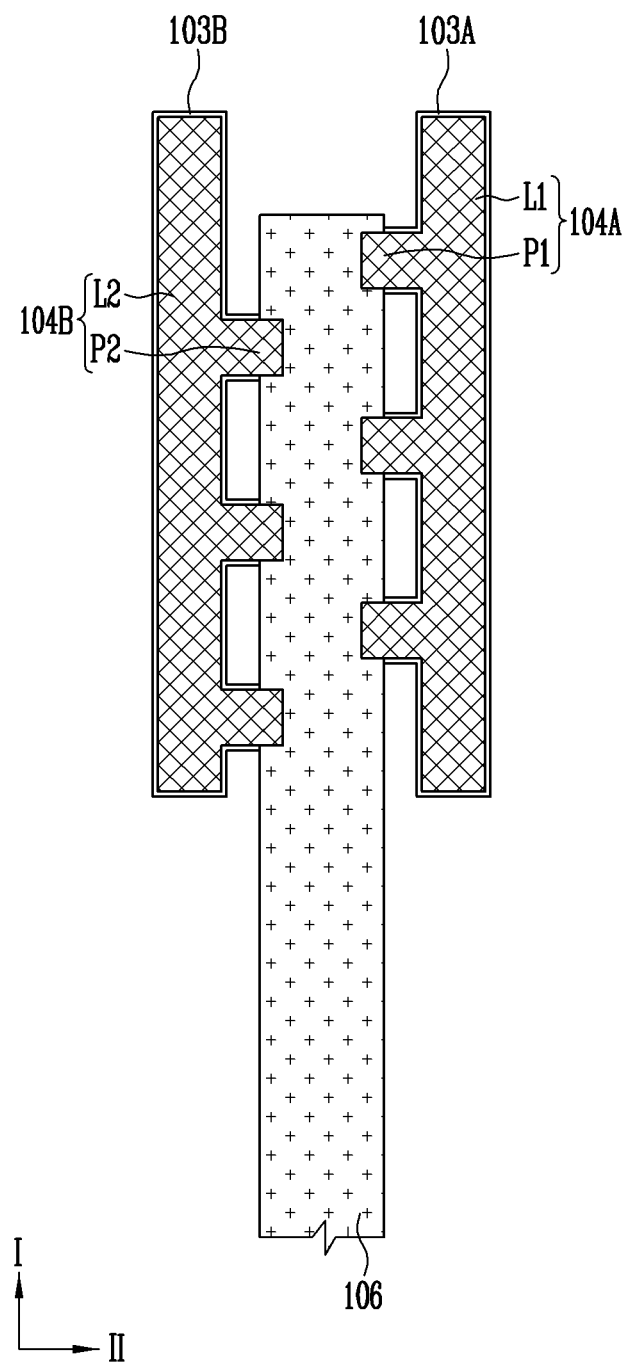
FIGS. 11A to 11D are views illustrating modifications of a conductive plug and a slit insulating layer in accordance with an embodiment of the present disclosure.

Referring to FIG. 11A, a slit insulating layer 106 extends in a first direction I, and may be connected to a plurality of conductive plugs 104A and 104B. The slit insulating layer 106 may be located between a first conductive plug 104A and a second conductive plug 104B. A first insulating spacer 103A may be formed to surround a portion of the first conductive plug 104A, and a second insulating spacer 103B may be formed to surround a portion of the second conductive plug 104B.

The first conductive plug 104A may include a first line pattern L1 extending in the first direction I and a plurality of first protrusion parts P1 protruding in a second direction II. The first protrusion parts P1 are located between the first line pattern L1 and the slit insulating layer 106, and protrude to the inside of the slit insulating layer 106.

The second conductive plug 104B includes a second line pattern L2 extending in the first direction I and a plurality of second protrusion parts P2 protruding in the second direction II. The second protrusion parts P2 are located between the second line pattern L2 and the slit insulating layer 106, and protrude to the inside of the slit insulating layer 106.

The first line pattern L1 and the second line pattern L2 may extend in parallel to each other in the first direction I. The first protrusion parts P1 and the second protrusion parts P2 may be arranged to miss each other or stated otherwise not at the same levels. The first protrusion parts P1 and the second protrusion parts P2 may be arranged in an alternating manner along the first direction I.

Figure 11B:
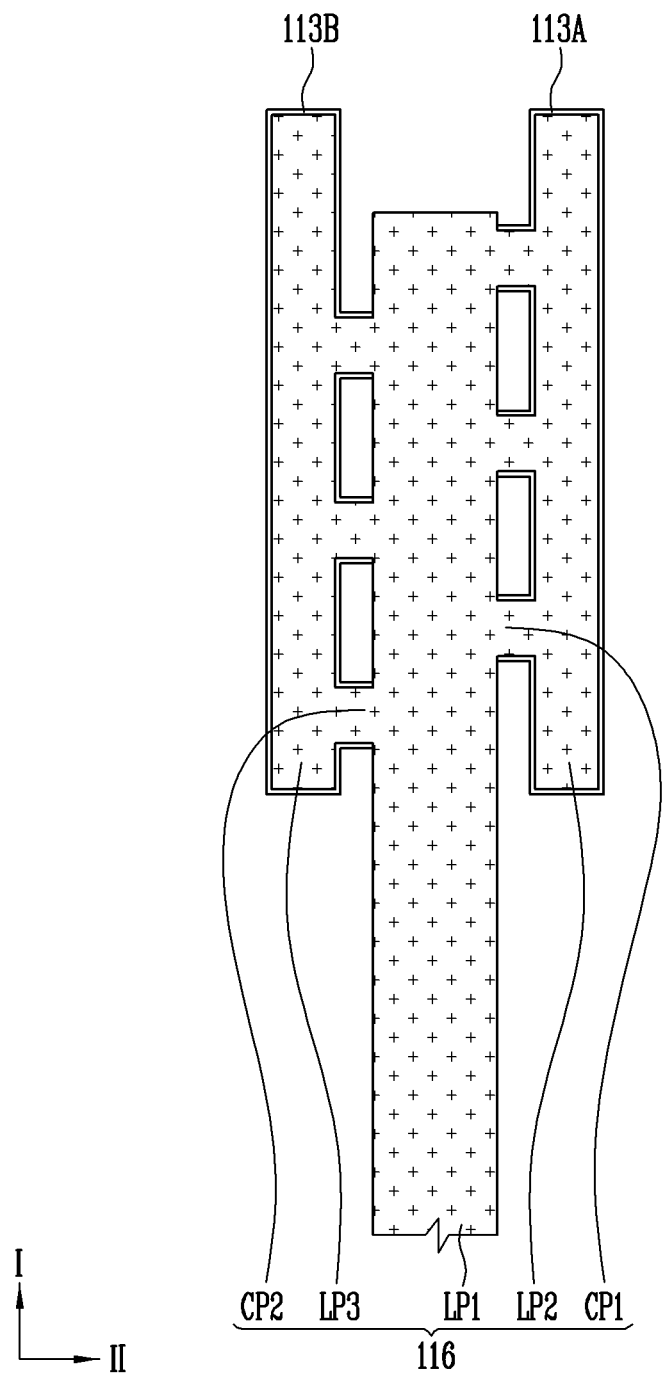

Referring to FIG. 11B, a slit insulating layer 116 may include a plurality of line patterns LP1 to LP3 each extending in the first direction I and connection patterns CP1 and CP2 connecting the plurality of line patterns LP1 to LP3 to each other.

A first line pattern LP1 may have a size larger in the first direction I than those of a second line pattern LP2 and a third line pattern LP3. The first line pattern LP1 may have a size larger in the second direction II than those of the second line pattern LP2 and the third line pattern LP3. The second and third line patterns LP2 and LP3 may have the same shape and positioned symmetrically along both sides of the first line pattern LP1.

The first line pattern LP1 and the second line pattern LP2 may be connected by a plurality of spaced apart first connection patterns CP1. The first line pattern LP1 and the third line pattern LP3 may be connected by a plurality of spaced part second connection patterns CP2.

A first insulating spacer 113A may be formed to surround the second line pattern LP2 and the first connection patterns CP1. A second insulating spacer 113B may be formed to surround the third line pattern LP3 and the second connection patterns CP2.

Figure 11C:
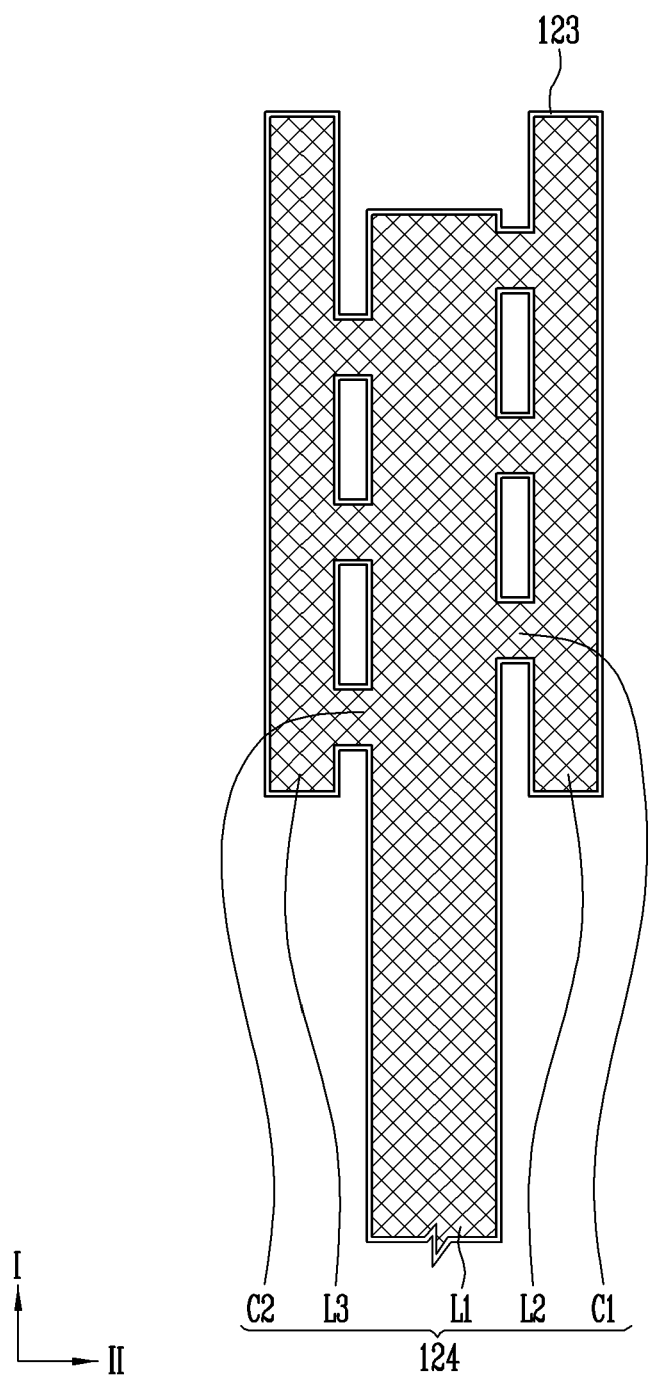

Referring to FIG. 11C, a conductive plug 124 may include a plurality of line patterns L1 to L3 and connection patterns C1 and C2 connecting the plurality of line patterns L1 to L3 to each other. A first line pattern L1 may have a size larger in the first direction I than those of a second line pattern L2 and a third line pattern L3. The first line pattern L1 may have a size larger in the second direction II than those of the second line pattern L2 and the third line pattern L3. The first line pattern L1 and the second line pattern L2 may be connected by a plurality of spaced apart first connection patterns C1. The first line pattern L1 and the third line pattern L3 may be connected by a plurality of spaced apart second connection patterns C2. An insulating spacer 123 may be formed to surround the first line pattern L1, the second line pattern L2, the third line pattern L3, the first connection patterns C1, and the second connection patterns C2.

Figure 11D:
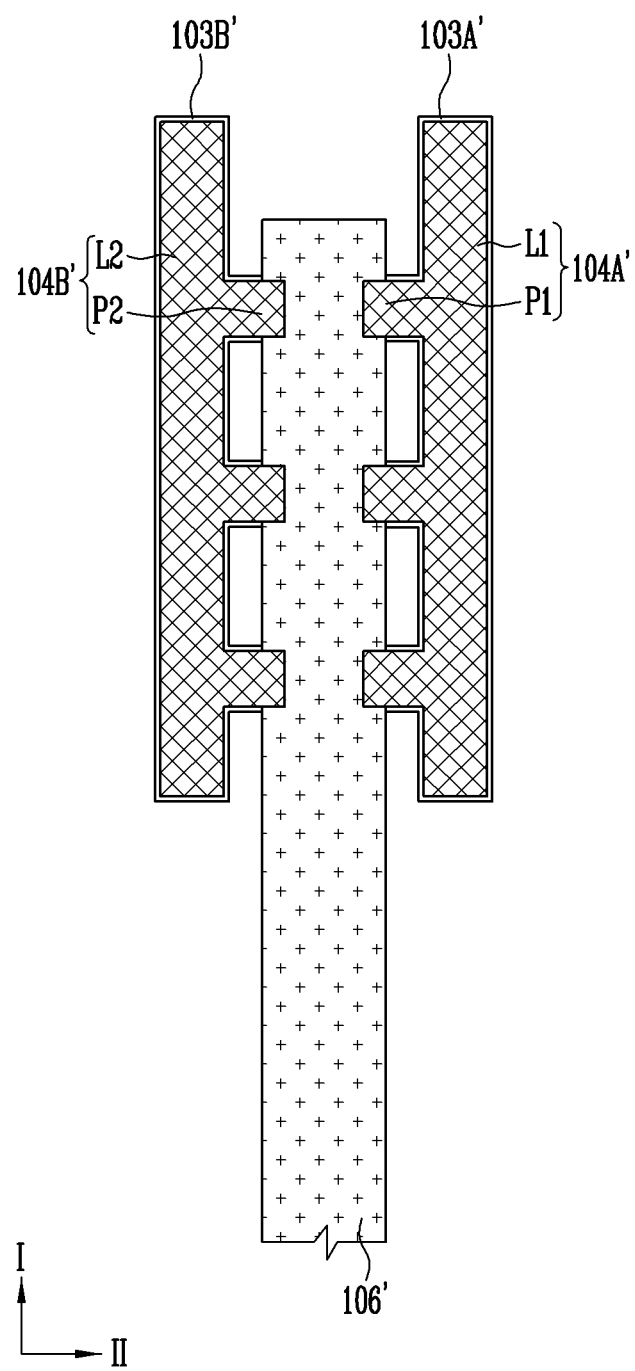

FIG. 11D is similar to FIG. 11A, but first protrusion parts P1 and second protrusion parts P2 are arranged to correspond to each other. A first conductive plug 104A' includes a first line pattern L1 extending in the first direction I and a plurality of first protrusion parts P1 protruding in the second direction II. A second conductive plug 104B' includes a second line pattern L2 extending in the first direction I and a plurality of second protrusion parts P2 protruding in the second direction II. A first insulating spacer 103A' may be formed to surround a portion of the first conductive plug 104A', and a second insulating spacer 103B' may be formed to surround a portion of the second conductive plug 104B'.

The structure shown in FIG. 11D may be modified in the same manner as FIGS. 11B and 11C described above.

Figure 12:
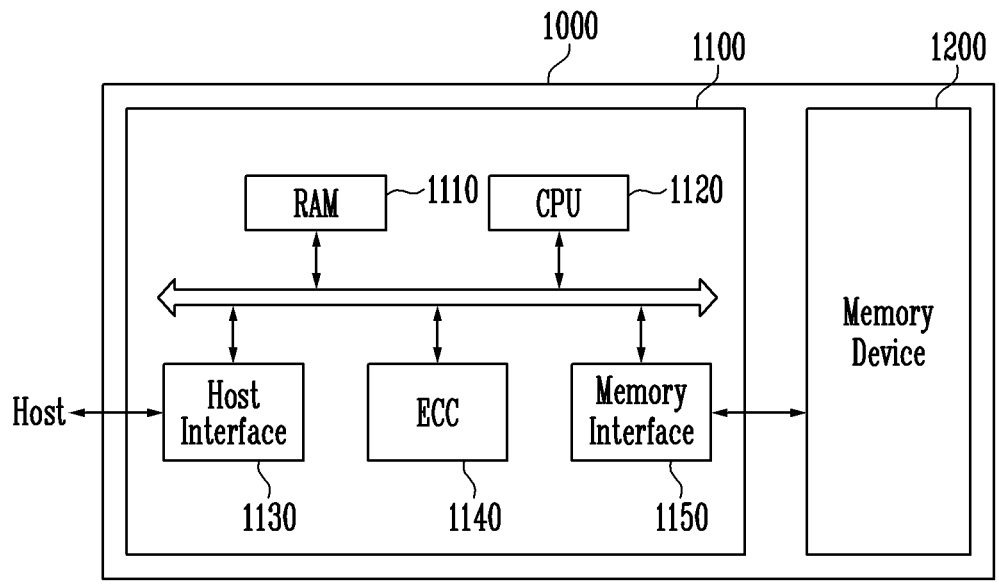
FIGS. 12 and 13 are block diagrams illustrating configurations of memory systems in accordance with embodiments of the present disclosure.

FIG. 12 is a block diagram illustrating a configuration of a memory system in accordance with an embodiment of the present disclosure.

Referring to FIG. 12, the memory system 1000 in accordance with an embodiment of the present disclosure includes a memory device 1200 and a controller 1100.

The memory device 1200 may store data information having various data formats such as texts, graphics, and software codes. The memory device 1200 may be a non-volatile memory. The memory device 1200 may have the structures described with reference to FIGS. 1A to 11D, and be manufactured according to the manufacturing methods described with reference to FIGS. 1A to 11D. In an embodiment, the memory device 1200 may include: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug. The structure and manufacturing method of the memory device 1200 are the same as described above, and therefore, their detailed descriptions will be omitted.

The controller 1100 may be connected to a host and the memory device 1200, and may be configured to access the memory device 1200 in response to a request from the host. For example, the controller 1100 may be configured to control reading, writing, erasing, and background operations of the memory device 1200.

The controller 1100 includes a random-access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random-access memory (SRAM), a read only memory (ROM), and the like.

The CPU 1120 may be configured to control overall operations of the controller 1100. For example, the CPU 1120 may be configured to operate firmware such as a flash translation layer (FTL) stored in the RAM 1110.

The host interface 1130 may be configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with an embodiment of the present disclosure includes the memory device 1200 having an improved degree of integration and improved characteristics, and thus the degree of integration and characteristics of the memory system 1000 can be improved.

Figure 13:
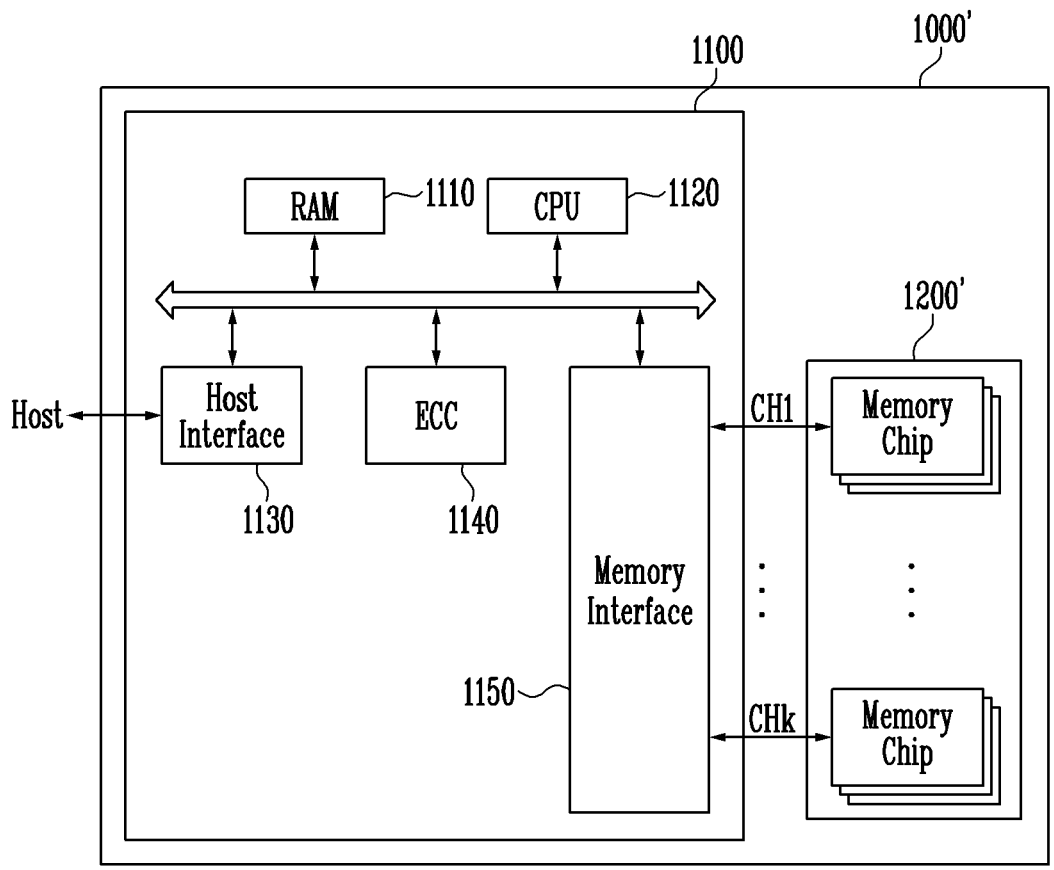

FIG. 13 is a block diagram illustrating a configuration of a memory system in accordance with an embodiment of the present disclosure. Hereinafter, descriptions of contents overlapping with those described above will be omitted.

Referring to FIG. 13, the memory system 1000' in accordance with an embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. The memory device 1200' may have the structures described with reference to FIGS. 1A to 11D, and be manufactured according to the manufacturing methods described with reference to FIGS. 1A to 11D. In an embodiment, the memory device 1200' may include: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip may be connected to one channel.

As described above, the memory system 1000' in accordance with an embodiment of the present disclosure includes the memory device 1200' having an improved degree of integration and improved characteristics, and thus the degree of integration and characteristics of the memory system 1000' can be improved. Particularly, the memory device 1200' may be configured as a multi-chip package, so that the data storage capacity of the memory system 1000' can be increased, and the operation speed of the memory system 1000' can be improved.

Figure 14:
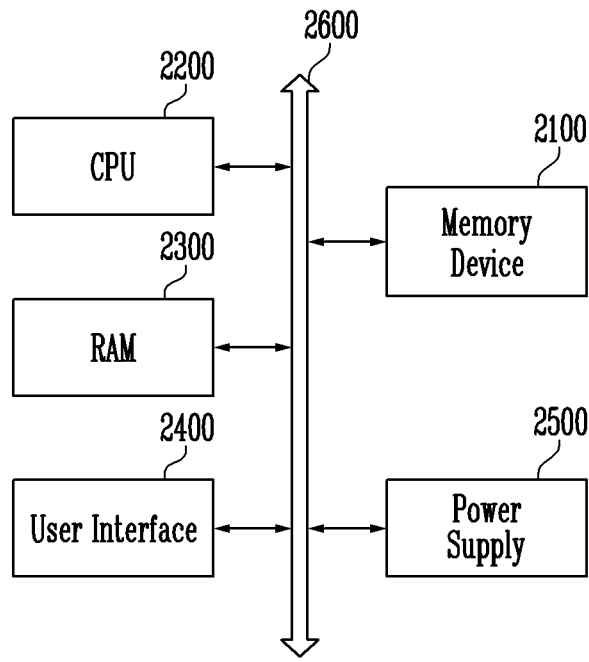
FIGS. 14 and 15 are block diagrams illustrating configurations of computing systems in accordance with embodiments of the present disclosure.

FIG. 14 is a block diagram illustrating a configuration of a computing system in accordance with an embodiment of the present disclosure. Hereinafter, description of contents overlapping with those described above will be omitted.

Referring to FIG. 14, the computing system 2000 in accordance with an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, and the like.

The memory device 2100 may be a nonvolatile memory. The memory device 2100 may have the structures described with reference to FIGS. 1A to 11D, and be manufactured according to the manufacturing methods described with reference to FIGS. 1A to 11D. In an embodiment, the memory device 2100 may include: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug. The structure and manufacturing method of the memory device 2100 are the same as described above, and therefore, their detailed descriptions will be omitted.

The memory device 2100 may be a multi-chip package including a plurality of memory chips as described with reference to FIG. 13.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 in accordance with an embodiment of the present disclosure includes the memory device 2100 having an improved degree of integration and improved characteristics, and thus characteristics of the computing system 2000 can also be improved.

Figure 15:
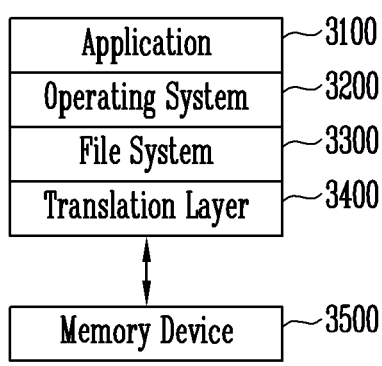

FIG. 15 is a block diagram illustrating a computing system in accordance with an embodiment of the present disclosure.

Referring to FIG. 15, the computing system 3000 in accordance with an embodiment of the present disclosure includes a software layer including an operating system 3200, an application 3100, a file system 3300, a translation layer 3400, and the like. In addition, the computing system 3000 includes a hardware layer of a memory device 3500, and the like.

The operating system 3200 may manage software resources, hardware resources, and the like. of the computing system 3000, and control program execution of a central processing unit. The application 3100 is one of a variety of application programs running on the computing system 3000, and may be a utility executed by the operating system 3200.

The file system 3300 means a logical structure for managing data, files, and the like in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory. The memory device 3500 may have the structures described with reference to FIGS. 1A to 11D, and be manufactured according to the manufacturing methods described with reference to FIGS. 1A to 11D. In an embodiment, the memory device 3500 may include: a first stack structure; a second stack structure; a slit insulating layer located between the first stack structure and the second stack structure, the slit insulating layer extending in a first direction; a conductive plug located between the first stack structure and the second stack structure, the conductive plug including a first protrusion part protruding to the inside of the slit insulating layer; and an insulating spacer surrounding a sidewall of the conductive plug. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with an embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability. Further, when the semiconductor device is manufactured, the level of difficulty of processes can be lowered, manufacturing procedures can be simplified, and manufacturing cost can be reduced.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
    a first stack structure including first conductive layers and first insulating layers, which are alternately stacked;
    a second stack structure including second conductive layers and second insulating layers, which are alternately stacked;
    a slit insulating layer located between the first stack structure and the second stack structure; and
    an insulating spacer surrounding a portion of the slit insulating layer, the insulating spacer exposing the other region.

2. The semiconductor device of claim 1, wherein the slit insulating layer includes a first line pattern extending in a first direction and a second line pattern extending in a second direction intersecting the first direction.

3. The semiconductor device of claim 2, wherein the insulating spacer surrounds an end of the first line pattern, and exposes the other region of the first line pattern and the second line pattern.

4. The semiconductor device of claim 3, wherein the end of the first line pattern has a size larger than that of the other region.

5. The semiconductor device of claim 1, wherein the slit insulating layer includes a first line pattern extending in a first direction, a second line pattern extending in a second direction intersecting the first direction, and a third line pattern extending in the second direction, the third line pattern being located between the second line pattern and an end of the first line pattern.

6. The semiconductor device of claim 5, wherein the insulating spacer surrounds the end of the first line pattern and the third line pattern, and exposes the other region of the first line pattern and the second line pattern.

7. The semiconductor device of claim 5, wherein the third line pattern has a size larger in the second direction than that of the second line pattern.

8. The semiconductor device of claim 1, wherein the slit insulating layer includes first to third line patterns extending in a first direction, first connection patterns connecting the first line pattern and the second line pattern to each other, and second connection patterns connecting the first line pattern and the third line pattern to each other.

9. The semiconductor device of claim 1, wherein the insulating spacer surrounds the second line pattern, the third line pattern, the first connection patterns, and the second connection patterns, and exposes the first line pattern.

10. The semiconductor device of claim 1, further comprising a dummy stack structure located between the first stack structure and the second stack structure, the dummy stack structure including third insulating layers and fourth insulating layers, which are alternately stacked.

11. The semiconductor device of claim 10, wherein a portion of the slit insulating layer protrudes to the inside of the dummy stack structure.

12. The semiconductor device of claim 10, wherein the first stack structure and the second stack structure are electrically separated from each other by the slit insulating layer, the insulating spacer, and the dummy stack structure.

* * * * *

UNITED STATES PATENT AND TRADEMARK OFFICE
CERTIFICATE OF CORRECTION

PATENT NO. : 11,574,869 B2
APPLICATION NO. : 17/141314
DATED : February 7, 2023
INVENTOR(S) : Ki Hong Lee et al.

Page 1 of 1

It is certified that error appears in the above-identified patent and that said Letters Patent is hereby corrected as shown below:

On the Title Page

Please correct Item (63), Related U.S. Application Data, and specifically the parent application number from [[16/657,787]] to --16/654,787--.

Signed and Sealed this
Twenty-seventh Day of August, 2024

Katherine Kelly Vidal
*Director of the United States Patent and Trademark Office*